(12) United States Patent
Ito et al.

(10) Patent No.: US 6,493,367 B1
(45) Date of Patent: Dec. 10, 2002

(54) SEMICONDUCTOR LASER DEVICE AND OPTICAL INFORMATION REPRODUCTION APPARATUS

(75) Inventors: Shigetoshi Ito, Ikoma (JP); Yukio Yamasaki, Tenri (JP); Mototaka Taneya, Nara (JP)

(73) Assignee: Sharp Kabushiki Kaisha (JP)

( * ) Notice: Subject to any disclaimer, the term of this patent is extended or adjusted under 35 U.S.C. 154(b) by 8 days.

(21) Appl. No.: 09/611,424

(22) Filed: Jul. 7, 2000

(30) Foreign Application Priority Data

Jul. 9, 1999 (JP) .......................... 11-195390
Jul. 6, 2000 (JP) ....................... 2000-205787

(51) Int. Cl.[7] ................................ H01S 5/00
(52) U.S. Cl. ........................................ 372/45
(58) Field of Search ................ 372/45, 46, 50

(56) References Cited

FOREIGN PATENT DOCUMENTS

| JP | 10-190132 A | * 7/1998 | ............. H01S/3/18 |
| JP | 11-243251 | 9/1999 | ............. H01S/3/18 |

OTHER PUBLICATIONS

Kuramoto, M. et al., (Feb. 15, 1999) "Room–temperature continuous–wave operation of InGaN multi–quantum–well laser diodes grown on an n–GaN substrate with a backside n–contact" *Jpn. J. Appl. Phys.*, Part 2, vol. 38(2B):L184–L186.

Bergmann, M.J. and Casey, H.C. (Aug. 1, 1998) "Optical–field calculations for lossy multiple–layer $Al_xGa_{1-x}N/In_xGa_{1-x}N$ laser diodes" *J. Appl. Phys.* vol. 84(3):1196–1203.

* cited by examiner

Primary Examiner—Quyen Leung
(74) Attorney, Agent, or Firm—Morrison & Foerster LLP

(57) ABSTRACT

A semiconductor laser device of the present invention includes, in this order: a GaN layer; an $Al_{x1}Ga_{1-x1}N$ ($0.05 \leq x1 \leq 0.2$) lower cladding layer; an $In_{y1}Ga_{1-y1}N$ ($0<y1<1$) lower guide layer (thickness: d1 [$\mu$m]); an active layer (thickness: Wa [$\mu$m]) have a multilayer structure comprising of alternating layers of a well layer and a barrier layer, the well layer comprising $Al_{s1}In_{b1}Ga_{1-a1-b1}N_{1-e1-f1}P_{e1}As_{f1}$ ($0 \leq a1, 0 \leq b1, a1+b1 \leq 1, 0 \leq e1, 0 \leq f1, e1+f1<0.5$), and the barrier layer comprising $Al_{a2}In_{b2}Ga_{1-a2-b2}N_{1-e2-f2}P_{e2}As_{f2}$ ($0 \leq a2, 0 \leq b2, a2+b2 \leq 1, 0 \leq e2, 0 \leq f2, e2+f2<0.5$); an $In_{y2}Ga_{1-y2}N$ ($0<y2<1$) upper guide layer (thickness: d2 [$\mu$m]); and an $Al_{x2}Ga_{1-x2}N$ ($0.5 \leq x2 \leq 0.2$) upper cladding layer, wherein: the thicknesses and the compositions of the lower guide layer and the upper guide layer are set such that ripples in a far field pattern in a direction perpendicular to a stack plane are suppressed.

21 Claims, 17 Drawing Sheets guiding layer Indium composition y1,y2

SEMICONDUCTOR LASER DEVICE AND OPTICAL INFORMATION REPRODUCTION APPARATUS

BACKGROUND OF THE INVENTION

1. Field of the Invention

The present invention relates to a semiconductor laser device using a gallium nitride type semiconductor and an optical information reproduction apparatus using such a semiconductor laser device. More particularly, the present invention relates to a semiconductor laser device having a desirable FFP (Far Field Pattern).

2. Description of the Related Art

Prototype semiconductor laser devices have been produced in the art using a nitride type semiconductor material, such as GaN, InN, AlN, or a mixture thereof, which emit light whose wavelength ranges from a blue region to a UV region. FIG. 16 illustrates a nitride semiconductor laser device 1600 oscillating at a wavelength of 405 nm, which was reported in Masaru KURAMOTO, et al., Jpn. J. Appl. Phys. vol. 38 (1999) pp. L184–L186. The semiconductor laser device 1600 includes an n-GaN layer 1601 (thickness: 100 $\mu$m). On the n-GaN layer 1601, the semiconductor laser device 1600 further includes an n-$Al_{0.7}Ga_{0.93}N$ lower cladding layer 1602 (thickness: 1 $\mu$m), an n-GaN lower guide layer 1603 (thickness: 0.1 $\mu$m), an $In_{0.2}Ga_{0.8}N$ (thickness: 3 nm)/$In_{0.05}Ga_{0.95}N$ (thickness: 5 nm)-triple quantum well active layer 1604, a p-$Al_{0.19}Ga_{0.81}N$ cap layer 1605 (thickness: 20 nm), a p-GaN upper guide layer 1606 (thickness: 0.1 $\mu$m), a p-$Al_{0.07}Ga_{0.93}N$ upper cladding layer 1607 (thickness: 0.5 $\mu$m), and a p-GaN contact layer 1608 (thickness: 0.05 $\mu$m), which are deposited in this order. Electrodes 1609 and 1610 are provided on the lower side and the upper side of the device, respectively. The semiconductor laser device 1600 has a waveguide structure in which the active layer 1604 and the guide layers 1603 and 1606 are interposed between the cladding layers 1602 and 1607, so that light generated in the active layer 1604 is confined in the waveguide structure so as to cause laser oscillation.

However, the conventional semiconductor laser device 1600 has the following problems. The present inventors have produced the semiconductor laser device 1600 with the above-described structure, and obtained an FFP as shown in FIG. 17. In FIG. 17, the horizontal axis represents the angle of the beam along a plane which is perpendicular to the plane of the active layer 1604 and parallel to the longitudinal direction of the optical cavity. The vertical axis represents a relative beam intensity value. In the present specification, the term "FFP" refers to an FFP (i.e., an angular distribution of the light beam intensity measured at a position apart from the laser light opening of the laser device) along a direction perpendicular to the plane of the active layer. In the graph of FIG. 17, FFPs 1701 and 1702 are FFPs which have been obtained with the semiconductor laser device 1600 having the above-described structure. The FFPs 1701 and 1702 have a sub-peak in the vicinity of +20° and have many ripples. As shown in FIG. 17, the ripples are very suppressed for some individual devices, e.g., as shown by the FFP 1701, and very significant for some other individual devices, e.g., as shown by the FFP 1702. An FFP 1703 is an FFP obtained with the semiconductor laser device 1600 in which the thickness of the n-$Al_{0.07}Ga_{0.93}N$ lower cladding layer 1602 is reduced from 1 $\mu$m to 0.7 $\mu$m. The FFP 1703 has a very large sub-peak in the vicinity of ±20°.

Although not shown in FIG. 17, research by the present inventors has demonstrated that ripples, including the sub-peak in the vicinity of 20°, are reduced by reducing the crystalline quality of the n-GaN layer 1601, which is used as a substrate, or by increasing the amount of impurity. Conversely, the ripples in the vicinity of ±20° are increased when using a high quality crystal with little crystalline defect for the GaN layer 1601 and/or reducing the impurity concentration of the GaN layer 1601 in order to obtain a semiconductor laser device having a long operating life. It is believed that the differences between the ripples of FFP 1701 and those of FFP 1702 occurs due to the slight difference in terms of the conditions as described above. Moreover, it was also experimentally demonstrated that the ripples are generally more significant when the thickness of the GaN layer 1601 under the lower AlGaN cladding layer 1602 is greater. Since the thickness of the substrate is normally as great as 50 $\mu$m or more, it is very difficult to suppress these ripples when using GaN as a substrate as compared to when sapphire is used as a substrate.

Thus, in the prior art, ripples occur in the FFP, and in worst cases, it is not possible to obtain a single-peak FFP intensity pattern. This can be suppressed by taking one of the above-described measures: (1) increasing the thickness of the lower cladding layer 1602: (2) reducing the crystalline quality of the GaN layer 1601; and (3) increasing the amount of impurity in the GaN layer 1601. However, if the AlGaN lower cladding layer 1602 is formed to be thick on the GaN layer 1601, as shown in (1) above, a crack may occur. If the crystalline quality of the GaN layer 1601 is reduced, as shown in (2) above, or the amount of impurity in the GaN layer 1601 is increased, as shown in (3) above, the operating life of the obtained semiconductor laser device 1600 may be reduced. Thus, these measures (1) to (3) have limited effects, and it has been difficult to adequately control the production process with a good yield.

Ripples occurring in an FFP are undesirable because they may result in insufficient focusing or generation of stray light when the device is used in an optical pickup, or the like.

SUMMARY OF THE INVENTION

According to one aspect of this invention, there is provided a semiconductor laser device, including, in this order: a GaN layer; an $Al_{x1}Ga_{1-x1}N$ ($0.05 \leq x1 \leq 0.2$) lower cladding layer; an $In_{y1}Ga_{1-y1}N$ ($0<y1<1$) lower guide layer (thickness: d1 [$\mu$m]); an active layer (thickness: Wa [$\mu$m]) having a multilayer structure comprising of alternating layers of a well layer and a barrier layer, the well layer comprising $Al_{a1}In_{b1}Ga_{1-a1-b1}N_{1-e1-f1}P_{e1}As_{f1}$ ($0 \leq a1$, $0 \leq b1$, $a1+b1 \leq 1$, $0 \leq e1$, $0 \leq f1$, $e1+f1<0.5$), and the barrier layer comprising $Al_{a2}In_{b2}Ga_{1-a2-b2}N_{1-e2-f2}P_{2e}As_{f2}$ ($0 \leq a2$, $0 \leq b2$, $a2+b2 \leq 1$, $0 \leq e2$, $0 \leq f2$, $e2+f2<0.5$); an $In_{y2}Ga_{1-y2}N$ ($0<y2<1$) upper guide layer (thickness: d2 [$\mu$m]); and an $Al_{x2}Ga_{1-x2}N$ ($0.05 \leq x2 \leq 0.2$) upper cladding layer, wherein: the thicknesses and the compositions of the lower guide layer and the upper guide layer are set such that ripples in a far field pattern in a direction perpendicular to a stack plane are suppressed.

According to another aspect of this invention, there is provided a semiconductor laser device, including, in this order: a GaN layer; an $Al_{x1}Ga_{1-x1}N$ ($0.05 \leq x1 \leq 0.2$) lower cladding layer; an $In_{y1}Ga_{1-y1}N$ ($0<y1<1$) lower guide layer (thickness: d1 [$\mu$m]); an active layer (thickness: Wa [$\mu$m]) having a multilayer structure comprising of alternating layers of a well layer and a barrier layer, the well layer comprising $Al_{a1}In_{b1}Ga_{1-a1-b1}N_{1-a1-f1}P_{a1}As_{f1}$ ($0 \leq a1$, $0 \leq b1$, $a1+b1 \leq 1$, $0 \leq e1$, $0 \leq f1$, $e1+f1<0.5$), and the barrier layer comprising $Al_{a2}In_{b2}Ga_{1-a2-b2}N_{1-e2-f2}P_{e2}As_{f2}$ ($0 \leq a2$, $0 \leq b2$, a2+b2<1, 0≦e2, 0≦f2, e2+f2<0.5); an $In_{y2}Ga_{1-y2}N$ (0<y2<1) upper guide layer (thickness: d2 [μm]); and an $Al_{x2}Ga_{1-x2}N$ (0.05≦x2≦0.2) upper cladding layer, wherein: the thicknesses and the compositions of the lower guide layer and the upper guide layer are set such that an oscillating mode effective refractive index $n_{eq}$ of oscillation light from the semiconductor laser device and a refractive index $n_{GaN}$ of the GaN layer have a relationship of $n_{eq} \geq n_{GaN}$.

According to still another aspect of this invention, there is provided a semiconductor laser device, including, in this order: a GaN layer; an $Al_{x1}Ga_{1-x1}N$ (0.05≦x1≦0.2) lower cladding layer; an $In_{y1}Ga_{1-y1}N$ (0<y1<1) lower guide layer (thickness: d1 [μm]); an active layer (thickness: Wa [μm]) having a multilayer structure comprising of alternating layers of a well layer and a barrier layer, the well layer comprising $Al_{a1}In_{b1}Ga_{1-a1-b1}N_{1-e1-f1}P_{e1}As_{f1}$ (0≦a1, 0≦b1, a1+b1≦1, 0≦e1, 0≦f1, e1+f1<0.5), and the barrier layer comprising $Al_{a2}In_{b2}Ga_{1-a2-b2}N_{1-e2-f2}P_{e2}As_{f2}$ (0≦a2, 0≦b2, a2+b2≦1, 0≦e2, 0≦f2, e2+f2<0.5); an $In_{y2}Ga_{1-y2}N$ (0<y2<1) upper guide layer (thickness: d2 [μm]); and an $Al_{x2}Ga_{1-x2}N$ (0.05≦x2≦0.2) upper cladding layer, wherein: the thicknesses and the compositions of the lower guide layer and the upper guide layer are set so as to satisfy one of the following relationships:

$0.06 \leq d1+d2 \leq 0.1$ and $0.06 \leq y1, 0.06 \leq y2$;

$0.1 < d1+d2 \leq 0.15$ and $0.04 \leq y1, 0.04 \leq y2$;

$0.15 < d1+d2 \leq 0.2$ and $0.03 \leq y1, 0.03 \leq y2$;

$0.2 < d1+d2 \leq 0.3$ and $0.015 \leq y1, 0.015 \leq y2$; and $0.3 < d1+d2$ and $0.01 \leq y1, 0.01 \leq y2$.

According to still another aspect of this invention, there is provided a semiconductor laser device, including, in this order: a GaN layer; an $Al_{x1}Ga_{1-x1}N$ (0.05≦x1≦0.2) lower cladding layer; an $In_{y1}Ga_{1-y1}N$ (0<y1<1) lower guide layer (thickness: d1 [μm]); an active layer (thickness: Wa [μm]) having a multilayer structure comprising of alternating layers of a well layer and a barrier layer, the well layer comprising $Al_{s1}In_{b1}Ga_{1-a1-b1}N_{1-e1-f1}P_{s1}As_{f1}$ (0≦a1, 0≦b1, a1+b1≦1, 0≦e1, 0≦f1, e1+f1<0.5), and the barrier layer comprising $Al_{a2}In_{b2}Ga_{1-a2-b2}N_{1-e2-f2}P_{e2}As_{f2}$ (0≦a2, 0≦b2, a2+b2<1, 0≦e2, 0≦f2, e2+f2<0.5); an $In_{y2}Ga_{1-y2}N$ (0<y2<1) upper guide layer (thickness: d2 [μm]); and an $Al_{x2}Ga_{1-x2}N$ (0.05≦x2≦0.2) upper cladding layer, wherein: the thicknesses and the compositions of the lower guide layer and the upper guide layer are set so as to satisfy the following relationships:

$y \geq 0.003/d - 0.003 + (0.007 - 0.22 \times Wa) + (-0.010 + 0.10xx)$

[where
d=(d1+d2)/2,
y=(y1×d1+y2×d2)/(d1+d2),
x=(x1+x2)/2].

According to still another aspect of this invention, there is provided an optical information reproduction apparatus for reproducing information recorded on an optical disk having an information recording surface by irradiating the optical disk with laser light and photoelectrically converting the laser light reflected from the optical disk, wherein the optical information reproduction apparatus uses a semiconductor laser device of the present invention as a light source.

According to still another aspect of this invention, there is provided an optical information reproduction apparatus for reproducing information recorded on an optical disk having an information recording surface by irradiating the optical disk with laser light and photoelectrically converting the laser light reflected from the optical disk, wherein the optical information reproduction apparatus uses a semiconductor laser device of the present invention as a light source.

According to still another aspect of this invention, there is provided an optical information reproduction apparatus for reproducing information recorded on an optical disk having an information recording surface by irradiating the optical disk with laser light and photoelectrically converting the laser light reflected from the optical disk, wherein the optical information reproduction apparatus uses a semiconductor laser device of the present invention as a light source.

According to still another aspect of this invention, there is provided an optical information reproduction apparatus for reproducing information recorded on an optical disk having an information recording surface by irradiating the optical disk with laser light and photoelectrically converting the laser light reflected from the optical disk, wherein the optical information reproduction apparatus uses a semiconductor laser device of the present invention as a light source.

According to still another aspect of this invention, there is provided a semiconductor laser device, including: a GaN layer; an $Al_{x1}Ga_{1-x1}N$ (0.05≦x1≦0.2) lower cladding layer; an $In_{y1}Ga_{1-y1}N$ (0<y1<1) lower guide layer; an active layer having a multilayer structure comprising of alternating layers of a well layer and a barrier layer, the well layer comprising $Al_{a1}In_{b1}Ga_{1-a1-b1}N_{1-e1-f1}P_{e1}As_{f1}$ (0≦a1, 0≦b1, a1+b1≦1, 0≦e1, 0≦f1, e1+f1<0.5), and the barrier layer comprising $Al_{a2}In_{b2}Ga_{1-a2-b2}N_{1-e2-f2}P_{e2}As_{f2}$ (0≦a2, 0≦b2, a2+b2≦1, 0≦e2, 0≦f2, e2+f2<0.5); and $In_{y2}Ga_{1-y2}N$ (0<y2<1) upper guide layer; and an $Al_{x2}Ga_{1-x2}N$ (0.05≦x2≦0.2) upper cladding layer, wherein: the thickness d1 μm of the lower guide layer, the In composition y1 of the lower guide layer, the thickness d2 μm of the upper guide layer, and the In composition y2 of the upper guide layer satisfy the following relationships:

$0.06 \leq d1+d2$, $0.01 \leq y1$, and $0.01 \leq y2$.

In one embodiment of the invention, the thickness d1 μm of the lower guide layer and the In composition y1 of the lower guide layer satisfy the following relationship: y1≦0.003/d1−0.003.

In one embodiment of the invention, the thickness d1 μm of the lower guide layer and the In composition y1 of the lower guide layer satisfy the following relationship: y1≧0.003/d1+0.002.

In one embodiment of the invention, the thickness d2 μm of the upper guide layer and the In composition y2 of the upper guide layer satisfy the following relationship: y2≧0.003/d2−0.003.

In one embodiment of the invention, the thickness d2 μm of the upper guide layer and the In composition y2 of the upper guide layer satisfy the following relationship: y2≧0.003/d2+0.002.

In one embodiment of the invention, the In composition y1 of the lower guide layer, the thickness d1 μm of the lower guide layer, the In composition y2 of the upper guide layer, the thickness d2 μm of the upper guide layer and the thickness Wa μm of the active layer satisfy the following relationship:

$y \geq 0.003/d - 0.003 + (0.007 - 0.22 \times Wa)$ where
d=(d1+d2)/2, and
y=(y1×d1+y2×d2)/(d1+d2).

In one embodiment of the invention, the In composition y1 of the lower guide layer, the thickness d1 μm of the lower guide layer, the In composition y2 of the upper guide layer, the thickness d2 μm of the upper guide layer and the thickness Wa μm of the active layer satisfy the following relationship:

$$y \geq 0.003/d + 0.002 + (0.007 - 0.22 \times Wa)$$

where d=(d1+d2)/2, and y=(y1×d1+y2×d2)/(d1+d2).

In one embodiment of the invention, the In composition y1 of the lower guide layer, the thickness d1 of the lower guide layer, the Al composition y2 of the upper guide layer, the thickness d2 of the upper guide layer and the Al composition x2 of the upper cladding layer satisfy the following relationship:

$$y \geq 0.003/d - 0.003 + (-0.010 + 0.10xx)$$

where d=(d1+d2)/2, y=(y1×d1+y2×d2)/(d1+d2), and x=(x1+x2)/2.

In one embodiment of the invention, the In composition y1 of the lower guide layer, the thickness d1 of the lower guide layer, Al composition x1 of the lower cladding layer, the In composition y2 of the upper guide layer, the thickness d2 of the upper guide layer and the Al composition x2 of the upper cladding layer satisfy the following relationship:

$$y \geq 0.003/d + 0.002 + (-0.010 + 0.10xx)$$

where d=(d1+d2)/2, y=(y1×d1+y2×d2)/(d1+d2), and x=(x1+x2)/2.

According to still another aspect of this invention, there is provided an optical information reproduction apparatus, including: a semiconductor laser device of the present invention; and a photodetector, wherein: laser light is emitted from the semiconductor laser device to irradiate an optical disk, and information recorded on the optical disk is reproduced based on the laser light reflected from the optical disk.

Thus, the invention described herein makes possible the advantages of: (1) eliminating the above-described problems and providing a nitride semiconductor laser device which is optimally used in an optical pickup; and (2) providing an optical information reproduction apparatus having a good focusing characteristic.

These and other advantages of the present invention will become apparent to those skilled in the art upon reading and understanding the following detailed description with reference to the accompanying figures.

DESCRIPTION OF THE PREFERRED EMBODIMENTS

The "lower guide layer" as used herein refers to a layer which does not contain Al as a constituent element and which is interposed between the AlGaN lower cladding layer and the active layer. The structure of this layer does not have to be a single layer structure. The layer may alternatively have a multilayer structure including 2, 3, 4, 5 or more thin layers of InGaN or GaN with various compositions, or may have a superlattice structure including a large number of thin layers. In such a case, the In composition y1 of the lower guide layer is calculated as a weighted average of the In compositions of the respective thin layers, with their various thicknesses being taken as weights. Similarly, the "upper guide layer" as used herein refers to a layer which does not contain Al as a constituent element and which is interposed between the AlGaN upper cladding layer and the active layer. The structure of this layer does not have to be a single layer structure. The layer may alternatively have a multi-layer structure including 2, 3, 4, 5 or more thin layers of InGaN or GaN with various compositions, or may have a superlattice structure including a large number of thin layers. In such a case, the In composition y2 of the upper guide layer is calculated as a weighted average of the In compositions of the respective thin layers, with their various thicknesses being taken as weights.

The principle of the present invention will first be described below.

In a semiconductor laser device which oscillates in a TE mode, the FFP intensity at an angle Θ is obtained by Fourier transformation of an electric field distribution E[x] along a direction x perpendicular to a stacked plane, with a coefficient of $(2\pi/\lambda) \sin\Theta$ ($\lambda$ is the oscillation wavelength). Therefore, when there is a strong vibration component having a cycle of Λ in the electric field distribution, ripples occur in a direction of Θ which satisfies the following relationship:

$$(2\pi/\Lambda) = (2\pi/\lambda)\sin\Theta \quad (1)$$

The ripples are more significant as the electric field distribution having this vibration component is greater, i.e., as the electric field strength is stronger or the electric field overlaps to a greater extent.

Figure 16:
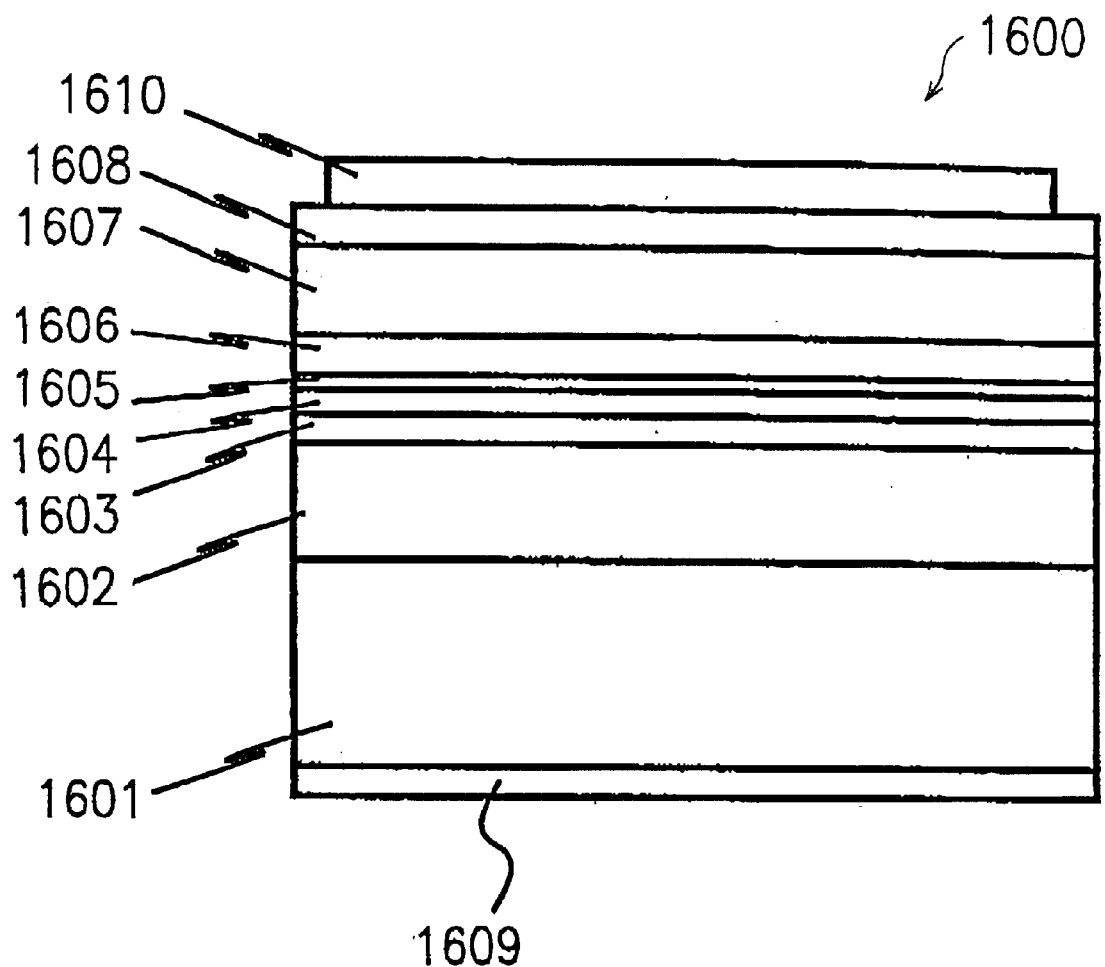
FIG. 16 illustrates a conventional semiconductor laser device.

In the conventional nitride semiconductor laser device 1600 illustrated in FIG. 16, the refractive index $n_{GaN}$ of the GaN layer is 2.540 and the effective refractive index $n_{eq}$ of the oscillating mode in the slab waveguide is estimated to be 2.51 with the waveguide theory. Thus, the relationship $n_{GaN} > n_{eq}$ holds. Therefore, the electric field E[x] is vibrating in the GaN layer with a cycle of Λ. This can be mathematically expressed as follows:

$$E[x] \sim exp[\pm j(2\pi/\Lambda)x] \quad (2)$$

$$\Lambda = \lambda/(n_{GaN}^2 - n_{eq}^2)^{0.5} \quad (3)$$

$$\sim 1 \, \mu m$$

Figure 17:
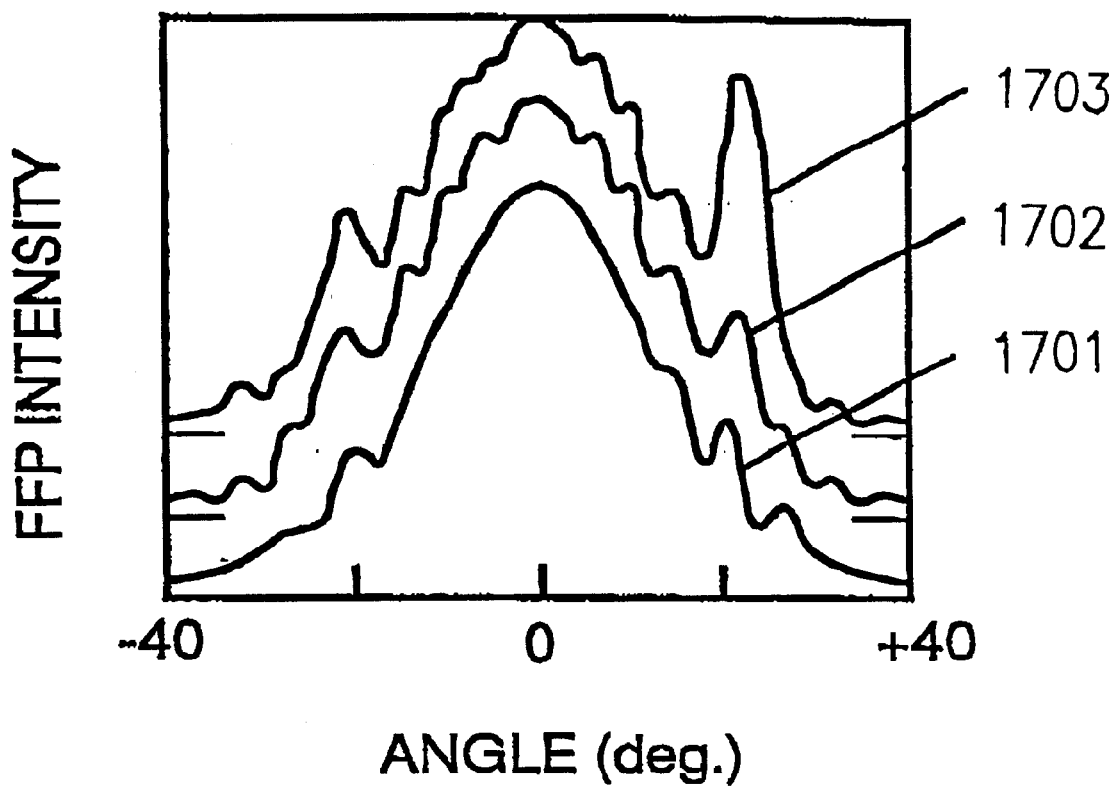
FIG. 17 illustrates FFP characteristics of a conventional semiconductor laser device.

Based on Expression (1) above, the ripple angle produced by Λ is about 23°, which generally matches with the position of the sub-peak in FIG. 17. It is believed that the increase in the sub-peak intensity in the vicinity of about ±20° when the thickness of the lower cladding layer 1602 is reduced, as seen in the FFP 1703, occurs as follows. That is, as the distance between the GaN layer 1601 and the active layer 1604/guide layers 1603 and 1606 is reduced, the electric field distribution to the GaN layer 1601 increases, thereby deteriorating the FFP. Moreover, an experiment by the present inventors has demonstrated that the FFP is improved on average when using a sapphire as a substrate while the thickness of the GaN layer 1601 is reduced. It is believed that this represents the result of the reduction in the electric field distribution to the GaN layer 1601. It is believed that ripples are reduced when the crystalline quality of the GaN layer 1601, as a GaN substrate, is reduced, and/or when the amount of impurity in the GaN layer 1601 is increased, for the following reasons. That is, these changes increase the optical absorption of the GaN layer 1601, thereby reducing the electric field distribution to the GaN layer in the oscillating mode and thus improving the FFP. Based on the above, the present inventors assumed that the ripples, which occur significantly in the vicinity of ±20°, are caused by the vibration of the electric field in the GaN layer 1601 which is present outside the lower cladding layer 1602.

The above discussion shows that ripples in an FFP, which occur due to the vibration of the electric field in the GaN layer 1601, can be completely eliminated by controlling the electric field in the GaN layer 1601 so that the electric field has no vibration component. This can be achieved by setting a real number as the argument of the exp function in Expression (2), i.e., $n_{GaN} \leq n_{eq}$. In such a case, the electric field E[x] in the GaN layer 1601 is attenuated in the x direction. For discussion purposes, the imaginary number component of the effective refractive index of the GaN layer is ignored because it is negligibly small with respect to the real number component. The present inventors conducted various studies on whether it is possible to change the value of $n_{eq}$ so as to satisfy such a condition, and found that it is possible to do so if the guide layer has a particular composition ($In_yGa_{1-y}N$ (0<y<1)) and a particular thickness.

Figure 1:
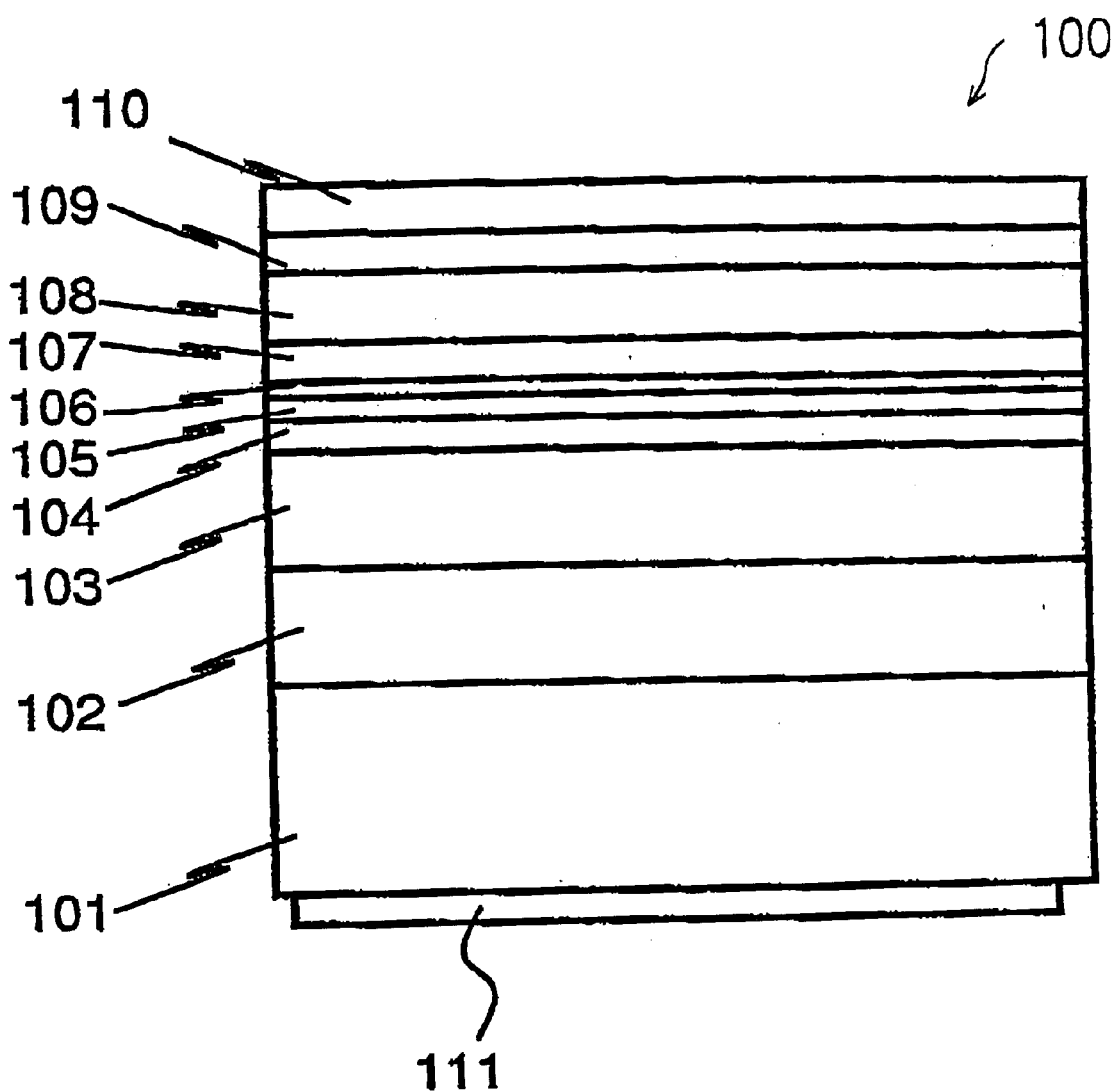
FIG. 1 illustrates a semiconductor laser device according to Embodiment 1 of the present invention.

FIG. 1 is a schematic diagram illustrating a semiconductor laser device 100 of the present invention. FIG. 1 illustrates a cross section of the semiconductor laser device 100 along the longitudinal direction of the laser device. The semiconductor laser device 100 includes an n-GaN substrate 101 (thickness: 30~300 μm). The semiconductor laser device 100 further includes: an n-GaN intermediate layer 102 (thickness: 0~30 μm); an n-$Al_{x1}Ga_{1-x1}N$ (0.05≤x1≤0.2) lower cladding layer 103 (thickness: 0.5 μm~10 μm); an n-$In_{y1}Ga_{1-y1}N$ (0>y1<b1) lower guide layer 104 (thickness: d1 [μm]); an active layer 105 (oscillation wavelength: 370–500 nm, total thickness: 5–60 nm) having a multilayer structure comprising of alternating layers of at least one $In_{b1}Ga_{1-b1}N$ (0<b1<1) well layer and at least one $In_{b2}Ga_{1-b2}N$ (0≤b2<b1) barrier layer; an AlGaN cap layer 106 (thickness: 0–20 nm); a p-$In_{y2}Ga_{1-y2}N$ (0<y2<b1) upper guide layer 107 (thickness: d2 [μm]); a p-$Al_{x2}Ga_{1-x2}N$ (0.05≤x2≤0.2) upper cladding layer 108 (thickness: 0.4 μm~10 μm); and a p-GaN contact layer 109. These nitride semiconductor layers are formed in this order on the n-GaN substrate 101. A metal electrode 110 (e.g., Pd/Au, Ni/Pd/Au, Pd/Pt/Au, or the like) is formed on the upper surface of the p-GaN contact layer 109, and a metal electrode 111 (e.g., Ti/Al, Zr/Al, Hf/Al, or the like) is formed on the reverse surface of then-GaN substrate 101. Herein, the n-GaN substrate 101 and the n-GaN intermediate layer 102 are collectively referred to as a GaN layer.

In the semiconductor laser device 100, the compositions and the thicknesses of the characteristics lower guide layer 104 and the upper guide layer 107 are set such that $n_{eq}$ of the oscillation mode and the refractive index $n_{GaN}$ of the GaN layer have the following relationship: $n_{eq} \geq n_{GaN}$.

The effective refractive index $n_{eq}$ can be obtained by an ordinary electric field distribution calculation in the slab waveguide. See, for example, M. J. Bergmann and H. C. Casey, Jr.: Appl. Phys. vol.84 (1998) pp. 1196–1203. The respective refractive indices $n_{eq}$ of the materials for an oscillation wavelength of λ [nm], which are parameters in the electric field distribution calculation, are obtained as follows. The oscillation wavelength λ can be set to be in the range of 300–800 nm.

First, the parameters Eg[eV] for the respective materials are given by the following expressions:

For $In_sGa_{1-s}N$ (0≤s≤1), $$Eg=Eg1[s]=3.42(1-s)+2.65s-3.94s(1-s) \quad (4)$$

For $Al_tGa_{1-t}N$ (0≤t≤1), $$Eg=Eg2[t]=3.42(1-t)+6.2t-1.057t(1-t) \quad (5)$$

$In_sAl_tGa_{1-s-t}N$ (0<s<1, 0<t1, 0≤s+t≤1)

$$Eg=\{s \times Eg1[s+t]+t \times Eg2[s+t]\}/(s+t) \quad (6)$$

Based on Expression (4) to (6), and assuming p[λ]=1/[1/λ−(Eg−3.42)/1239.852], the refractive index n(p[λ]) is obtained as shown in Expression (7) and (8) below:

When p[λ]>360.7, $$n_{eq}(p[\lambda])=[4.3663801+p^2/(p^2-295.9^2)]^{0.5} \quad (7)$$

When p[λ]≤360.7, $$n_{eq}(p[\lambda])=c0+c1 \times q+c2 \times q^2+c3 \times q^3+c4 \times q^4 \quad (8)$$

where q=p[λ]−360, c0=2.718, c1=9.976e-3, c2=3.005e-4, c3=4.584e-6, and c4=2.596e-8.

In the present invention, $n_{eq}$ is obtained by the above-described electric field distribution calculation in the slab waveguide using the parameters as defined herein.

Except for layers made of a semiconductor having a composition such that the energy gap is smaller than that of the well layer and layers made of a metal, the absorption coefficient in each of the layers forming the laser structure can be ignored since it is negligibly small. The layer 101, which is a substrate, normally has a thickness of 50 μm or more, which is considerably larger than that of a portion of the device from the lower guide layer 104 to the upper guide layer 107 (normally, 0.4 μm or less), which is a core portion characteristics of the LD waveguide structure. Therefore, the influence of the thickness of the layer 101 on the oscillating mode by the bottom surface of the substrate can be ignored since it is negligibly small. Thus, the electric field distribution calculation can be performed while considering the thickness of the layer 101, which is a substrate, to be infinite. With the above-described procedure, the thickness and the compositions of the characteristics InGaN lower guide layer 104 and the InGaN upper guide layer 107 can be selected such that $n_{eq} \geq n_{GaN}$.

As a result, with the above-described procedure, it can be seen that the above-described conditions can be satisfied generally when $0.06 \leq d1+d2$, $0.01 \leq y1$, and $0.01 \leq y2$. More specifically, $0.06 \leq y1$, and $0.06 \leq y2$ when $0.06 \leq d1+d2 \leq 0.1$; $0.04 \leq y1$ and $0.04 \leq y2$ when $0.1 < d1+d2 \leq 0.15$; $0.03 \leq y1$ and $0.03 \leq y2$ when $0.15 < d1+d2 \leq 0.2$; $0.015 \leq y1$ and $0.015 \leq y2$ when $0.2 < d1+d2 \leq 0.3$; and $0.01 \leq y1$ and $0.01 \leq y2$ when $0.3 \leq d1+d2$.

The "lower guide layer 104" as used herein refers to a layer which does not contain Al as a constituent element and which is interposed between the AlGaN lower cladding layer 103 and the active layer 105. The structure of this layer does not have to be a single layer structure. The layer may alternatively have a multilayer structure including 2, 3, 4, 5 or more thin layers of InGaN or GaN with various compositions, or may have a superlattice structure including a large number of thin layers. In such a case, the In composition y1 of the lower guide layer 104 is calculated as a weighted average of the In compositions of the respective thin layers, with their various thickness being taken as weights. Similarly, the "upper guide layer 107" as used herein refers to a layer which does not contain Al as a constituent element and which is interposed between the AlGaN upper cladding layer 103 and the active layer 105. The structure of this layer does not have to be a single layer structure. The layer may alternatively have a multilayer structure including 2, 3, 4, 5 or more thin layers of InGaN or GaN with various compositions, or may have a superlattice structure including a large number of thin layers. In such a case, the In composition y2 of the upper guide layer 107 is calculated as a weighted average of the In compositions of the respective thin layers, with their various thickness being taken as weights.

When the semiconductor laser device 100 was produced so as to satisfy these conditions, it was possible to always obtain a single-peak FFP in which ripples, which appear in FIG. 17, were suppressed to an insignificant level (10% or less), thereby realizing good optical characteristics.

Embodiment 1

In this embodiment, the thickness and the compositions of the respective layers of the characteristics semiconductor laser device 100 whose schematic diagram is shown in FIG. 1 were as follows: an n-GaN substrate 101 (thickness: 100 μm); an n-GaN intermediate layer 102 (thickness: 3 μm); an n-Al$_{x1}$Ga$_{1-x1}$N (x1=0.1) lower cladding layer 103 (thickness: 0.8 μm); an n-In$_{y1}$Ga$_{1-y1}$N (y1=0.035) lower guide layer 104 (thickness: 0.1 μm); a quintuple quantum well active layer 105 (oscillation wavelength: 410 nm, total thickness: 34 nm) having a multilayer structure (barrier layer/well layer/.../well layer/barrier layer) comprising of alternating layers of at least one In$_{b1}$Ga$_{1-b1}$N (b1 is about 0.17) well layer (thickness: 2 nm) and at least one In$_{b2}$Ga$_{1-b2}$N (b2=0.05) barrier layer (thickness: 4 nm); an Al$_z$Ga$_{1-z}$N (Z=0.2) cap layer 106 (thickness: 18 nm); a p-In$_{y2}$Ga$_{1-y2}$N (y2=0.035) upper guide layer 107 (thickness: 0.1 μm); a p-Al$_{x2}$Ga$_{1-x2}$N (x2=0.1) upper cladding layer 108 (thickness: 0.5 μm); and a p-GaN contact layer 109 (thickness: 0.5 μm).

Figure 2:
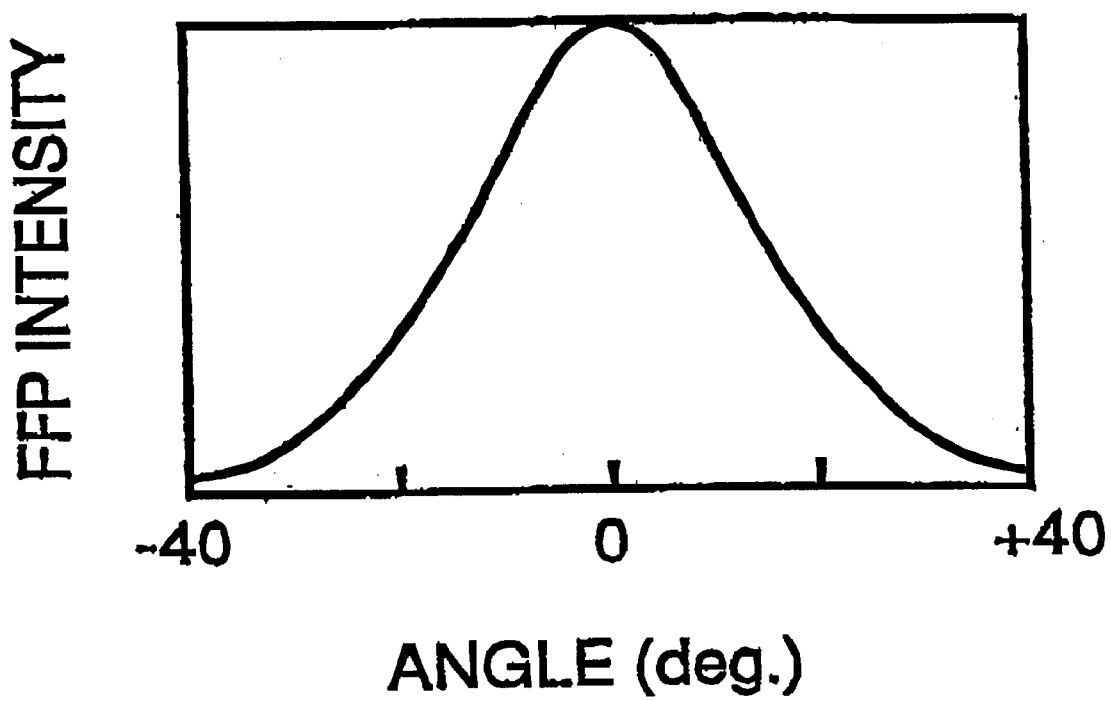
FIG. 2 illustrates FFP characteristics of a semiconductor laser device of the present invention.

When the FFP was measured with the semiconductor laser device 100 of the present embodiment, a single-peak profile as shown in FIG. 2 was obtained, with little ripples (3% or less), demonstrating that good radiation characteristics can be obtained with this structure. The oscillation threshold at room temperature was 60 mA, and a continuous oscillation operation was confirmed even at 80° C.

As comparative example, another semiconductor laser device was produced by using GaN as in the conventional semiconductor laser device 1600, instead of InGaN in the guide layers 104 and 107 of the semiconductor laser device 100 of the present embodiment. The laser device had FFP characteristics with ripples as those of the FFP 1702 shown in FIG. 17. This indicates that the present embodiment provides a semiconductor laser device having good optical characteristics.

The effective refractive index of the oscillation mode of the semiconductor laser device 100 of the present embodiment was estimated by the above-described method and was shown to be $n_{eq}$=2.547, which is greater than the refractive index $n_{GaN}$ of the GaN layer (2.540). It is believed that this led to the elimination of the vibration component in the electric field in the n-GaN substrate 101, the n-GaN intermediate layer 102, the p-GaN contact layer 109, etc., thereby resulting in good radiation characteristics.

Figure 3:
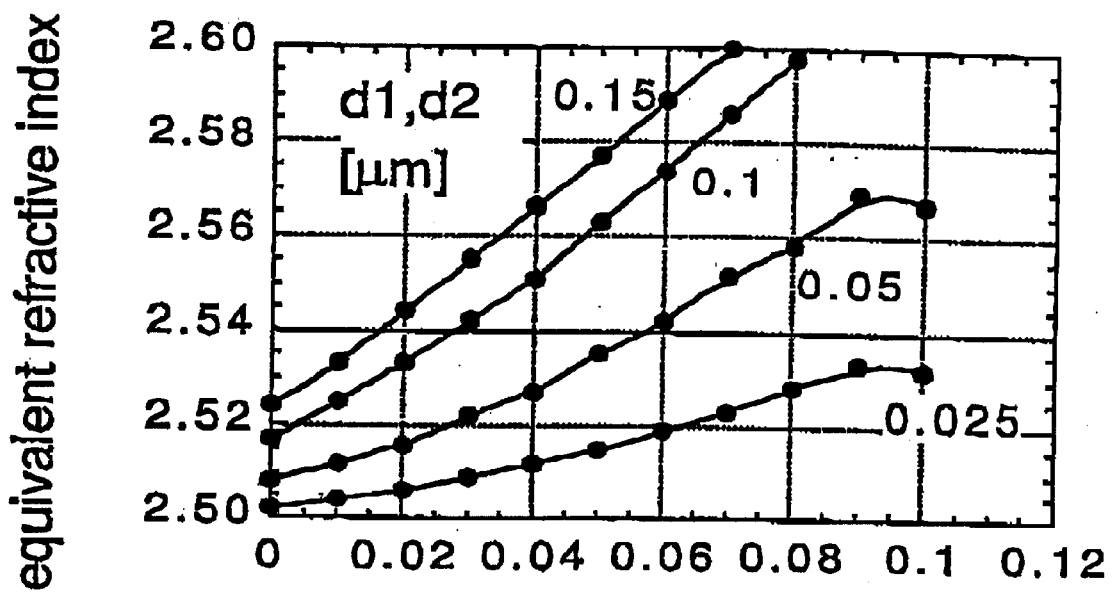
FIG. 3 illustrates the relationship between a guide layer In composition and an effective refractive index.

Next, the graph of FIG. 3 shows the effective refractive indices calculated while varying the In compositions y1 and y2 and the thicknesses d1 [μm] and d2 [μm] of the n-In$_{y1}$Ga$_{1-y1}$N lower guide layer 104 and the p-In$_{y2}$Ga$_{1-y2}$N upper guide layer 107. In FIG. 3, the dots represent calculated values which are connected together with smooth curves. For the sake of simplicity, the device was set such that the guide layers 104 and 107 have the same In composition and the same thickness, i.e., y1=y2 and d1=d2. The four curves represent respectively different thicknesses of the guide layers 104 and 107 (d1=d2). As shown in FIG. 3, where the In composition of the guide layer is 0, 1.e., where the guide layer is made of GaN, the value of the effective refractive index does not exceed the refractive index of GaN (2.540) even when the guide layer thickness is varied from 0.025 to 0.15 μm. Generally, the effective refractive index increases as the In composition of the guide layer is varied from 0 toward 0.09 or as the guide layer thickness is increased. When the guide layer thickness is 0.15 μm, the In composition is about 0.016 or more. When the guide layer thickness is 0.1 μm, the In composition is about 0.028 or more. When the guide layer thickness is 0.05 μm, the In composition is about 0.057 or more. When such conditions are satisfied, the value of the effective refractive index exceeds the GaN refractive index (2.540). When the guide layer thickness is 0.025 μm, the value of the effective refractive index does not exceed the GaN refractive index (2.540) for any In composition. As described above, the lower guide layer 104 as used herein refers to a layer which does not contain Al as a constituent element and which is interposed between the AlGaN lower cladding layer 103 and the active layer 105. The structure of this layer does not have to be a single layer structure. The layer may alternatively have a multilayer structure including 2, 3, 4, 5 or more thin layers of InGaN or GaN with various compositions, or may have a superlattice structure including a large number of thin layers. In such a case, the In composition y1 of the lower guide layer 104 is calculated as a weighted average of the In compositions of the respective thin layers, with their various thickness being taken as weights. This similarly applies to Embodiments 2 to 9. Similarly, the upper guide layer 107 as used herein refers to a layer which does not contain Al as a constituent element and which is interposed between the AlGaN upper cladding layer 108 and the active layer 105. The structure of this layer does not have to be a single layer structure. The layer may alternatively have a multilayer structure including 2, 3, 4, 5 or more thin layers of InGaN or GaN with various compositions, or may have a superlattice structure including a large number of thin layers. In such a case, the In composition y2 of the upper guide layer 107 is calculated as a weighted average of the In compositions of the respective thin layers, with their various thickness being taken as weights. This similarly applies to Embodiment 2 to 9.

Figure 4:
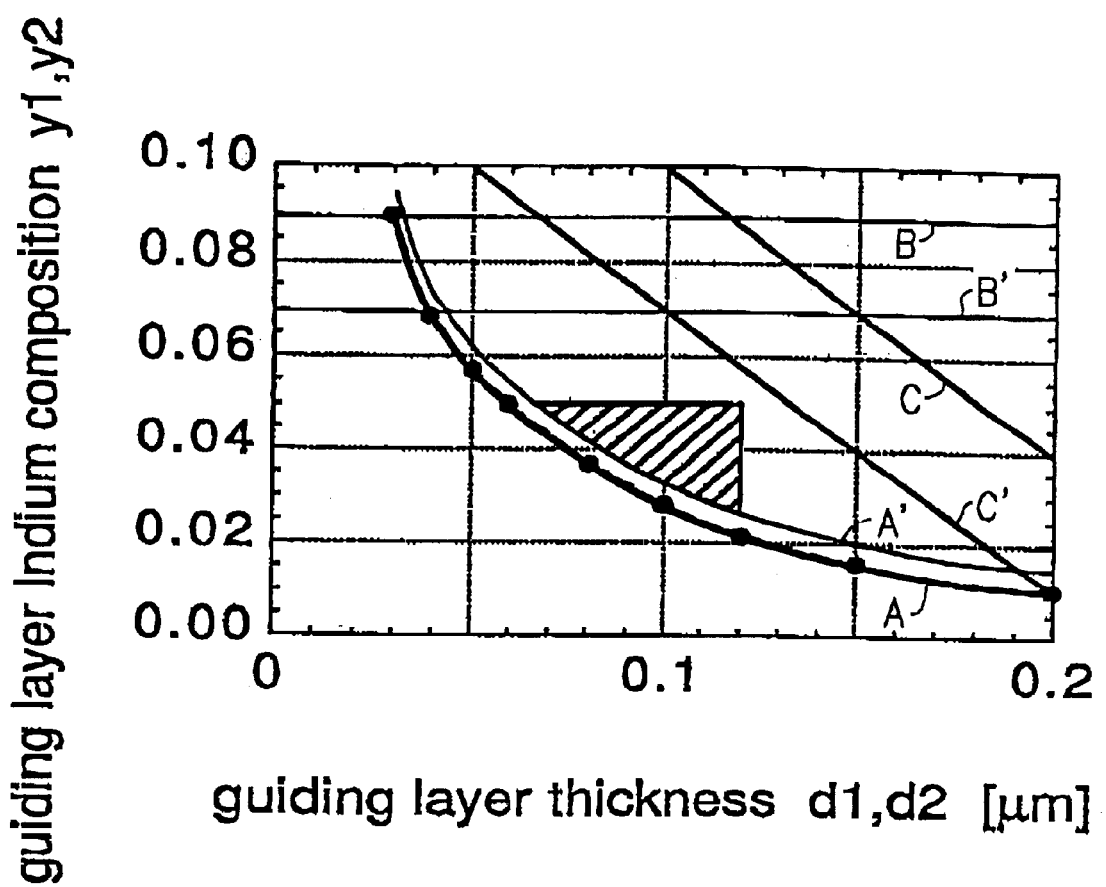
FIG. 4 illustrates conditions for a guide layer in a semiconductor laser device of the present invention.

In FIG. 4, smooth curve A connecting the dots together represents the thickness of the guide layers and the In composition of the guide layers (where the guide layers 104 and 107 have the same thickness and the same In composition, i.e., d1=d2 and y1=y2) with which the effective refractive index $n_{eq}$ equals the refractive index $n_{GaN}$ of GaN. In FIG. 4, the horizontal axis represents the guide layer thickness and the vertical axis represents the guide layer In composition. Curve A can be approximated by a function y1=0.003/d1−0.003. In a region on or above curve A, i.e., a region where y1≧003/d1−0.003 is approximately satisfied, the effective refractive index $n_{eq}$ is equal to or greater than the GaN refractive index $n_{GaN}$ ($n_{eq} \geq n_{GaN}$), and it is possible to obtain good optical characteristics without ripples due to the GaN layers 101 or 102, which is a substrate. Similarly, if y2≦0.003/d2−0.003 is satisfied, the effective refractive index $n_{eq}$ is equal to or greater than the GaN refractive index $n_{GaN}$ ($n_{eq} \geq n_{GaN}$), and it is possible to obtain good optical characteristics.

For the sake of simplicity, the calculation results shown in FIGS. 3 and 4 were obtained while the InGaN guide layers 104 and 107 have the same thickness and the same In composition (d1=d2 and y1=y2). Alternatively, the InGaN guide layers 104 and 107 may have different thicknesses and/or different In compositions. In such a case, if the average thickness of the upper and lower guide layers (i.e., (d1+d2)/2=d) is considered as the guide layer thickness d, the relationships shown in FIGS. 3 and 4 remain substantially unchanged. If the weighted average of the compositions of the upper and lower guide layers (i.e., y1×d1×y2× d2)/(d1+d2)=y) is considered as the guide layer In composition y, the relationships shown in FIGS. 3 and 4 can be applied similarly. In practice, however, if the degree of asymmetry is excessively increased, the asymmetry may adversely affect the light confinement in the active layer. Therefore, the degree of asymmetry should be limited to a certain degree. In practice, the difference between y1 and y2 (y1−y2) preferably satisfies the relationship of −0.05≦y1−y2≦0.05 and, more preferably, −0.03≦y1−y2≦0.03. In practice, the ratio between d1 and d2 (d1/d2) preferably satisfies the relationship of 0.33≦d1/d2≦3 and, more preferably, 0.56≦d1/d2≦1.8.

Other semiconductor laser devices satisfying the conditions represented by curve A were produced. With conditions close to those represented by curve A, e.g., d=0.1 [μm] and y=0.03, or d=0.07 [μm] and y=0.045, the ripples in FFPs are not always prevented completely. Rather, some of such devices on the same wafer may have small ripples in the vicinity of 0° in the FFPs (i.e., in the vicinity of the optical axis). It is assumed that this occurs for the following reason. In the case of crystal growth of InGaN, a phase separation, i.e., a slight variation in the composition of the crystal, is likely to occur. In such regions where the composition of the crystal varies, the conditions represented by curve A may not be satisfied, which adversely affects the optical characteristics of the devices. It has been experimentally demonstrated that such problems do not occur when y≧0.003/d+0.002 is satisfied. This critical condition is represented by curve A' in FIG. 4.

In order to obtain good optical characteristics, the composition y and the thickness d of each of the guide layers 104 and 107 are limited to the upper right region of FIG. 4 defined by and including curve A, and more preferably to a smaller upper right region of FIG. 4 defined by and including curve A'. However, due to the following requirements, the "preferred region" of the parameters of the guide layers 104 and 107 is even more limited. First, it has been experimentally demonstrated that the composition needs to satisfy y1≦b1−0.08 and y2≦b1−0.08 in order to sufficiently confine carriers in the well layer. In the present embodiment, where b1 is about 0.17, the In composition is preferably less than about 0.09. In FIG. 4, line B represents the In composition of 0.09. The region below line B is a desired region. When the In composition of the guide layer increased beyond this region and approached the In composition of the well layer, the carrier confinement became insufficient, whereby an oscillation operation could not be realized or the threshold became very high. More preferably, y1≦b1−0.1 and y2≦b1−0.1 are satisfied (the region below line B' in FIG. 4). In such a case, the increase in the threshold was suppressed even at high temperatures and it was possible to realize an operating life equal to or greater than 1000 hours at 50° C. It has been found that most preferably, the In composition of each of the guide layers 104 and 107 is less than that of the barrier layer so that y1<b2 and y2<b2. It is believed that by satisfying such conditions, a desirable carrier confinement in the well layer can be obtained. When such conditions were satisfied, it was possible to ensure an operating life equal to or greater than 1000 hours at 70° C. Although these preferred conditions will not be repeated in Embodiments 2 to 9 to follow in order to avoid redundancy, they can similarly be applied in the following embodiments.

It has also been found that a thick guide layer with a large In composition raises problems with respect to the noise characteristics and the operating life of the semiconductor laser device. It is assumed that these problems are caused by the following factors, modification of the composition of the active layer itself due to the composition variation occurring during crystal growth; and the comparative variation of the guide layer itself causing a spatial variation in the carrier implantation into the active layer, thereby adversely affecting the noise characteristics and the operating life of the device. Accordingly, the preferred thickness range for the guide layers 104 and 107 is limited. With a crystal where the In composition is 0.01 or more, if the relationship y≦0.16−0.6xd is satisfied (i.e., in the lower left region of FIG. 4 defined by line C), it is possible to form a desirable InGaN film and to realize a low-noise oscillation operation with a relative noise intensity of −125 dB/Hz or less and with an amount of return light in the range of 0.001–10%. In this range, it was possible to ensure an operating life equal to or greater than 1000 hours at room temperature. More preferably, when the relationship y≦0.13–0.6xd is satisfied (i.e., in the lower left region of FIG. 4 defined by line C'), it is possible to realize a low-noise oscillation operation with a relative noise intensity of −130 dB/Hz or less and with an amount of return light in the range of 0.001–10%. In this range, it is possible to ensure an operating life equal to or greater than 10000 hours at 40° C.

In order to produce a laser device having good characteristics with a good lot yield, the guide layer thickness d is preferably less than out equal to 0.12 μm for a crystal of y1≧0.02, y2≧0.02. When the guide layer thickness d exceeded 0.12 μm, the wafer after the crystal growth sometimes appeared to be blackish due to deposition of In metal, and most of the semiconductor laser devices produced from such a wafer had poor characteristics (though this was not always the case). However, this problem was prevented by setting the value d so as to satisfy d≦0.12. In FIG. 4, the hatched region represents the most preferred region (y≧0.003/d+0.002, y1≦b1−0.1, y2≦b1−0.1, y1<b2, y2<b2 and d≦0.12, where b1=0.17 and b2=0.05).

Although these preferred conditions will not be repeated to Embodiments 2 to 9 to follow in order to avoid redundancy, they can similarly be applied in the following embodiments.

Moreover, the above-described relationship did not change when the composition of the active layer was adjusted so that the oscillation wavelength was in the range of 380–430 nm (20° C.).

Embodiment 2

Figure 5:
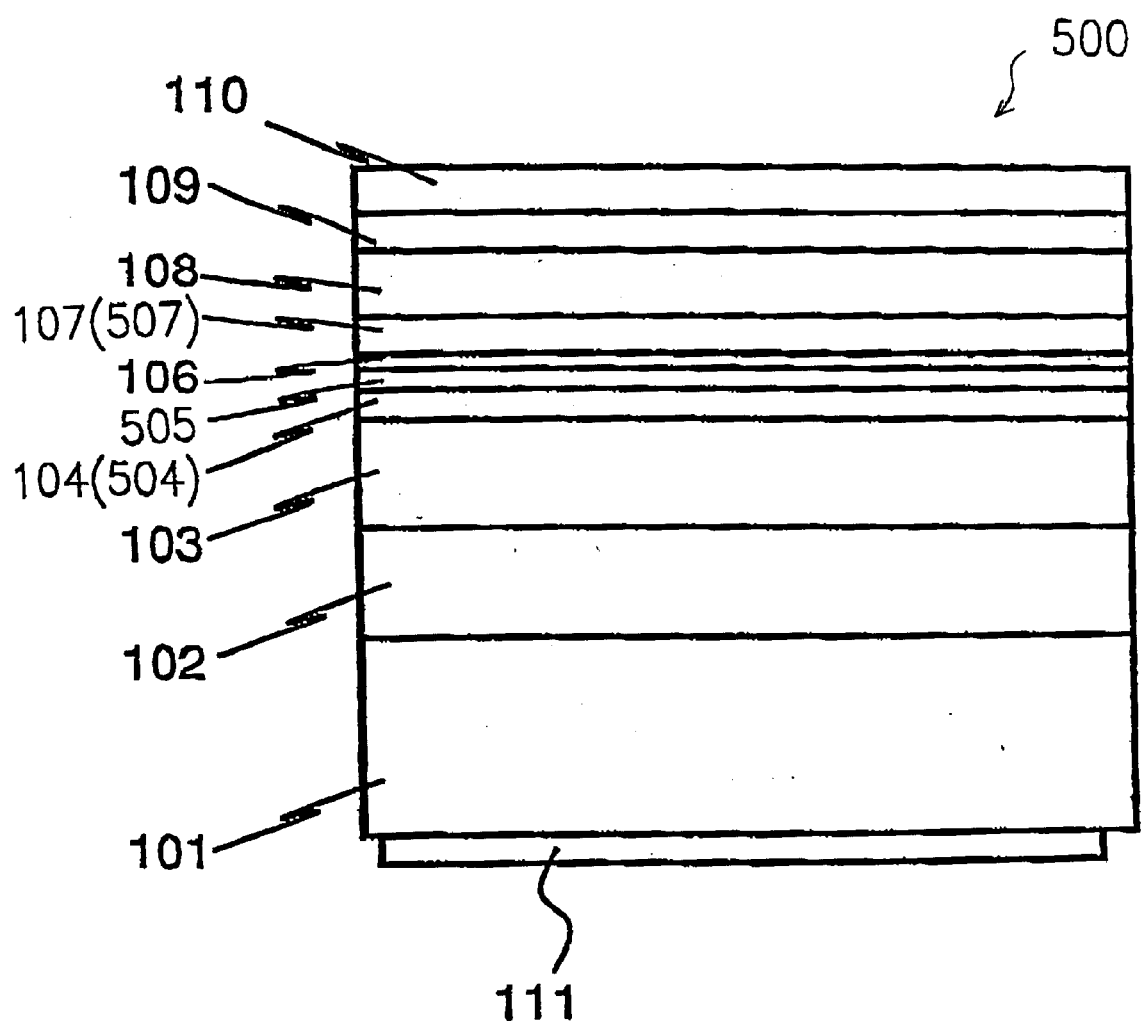
FIG. 5 illustrates a semiconductor laser device according to Embodiment 2 of the present invention.

FIG. 5 illustrates a semiconductor laser device 500 of this embodiment. The semiconductor laser device 500 has the same structure as that of the semiconductor laser device 100 of Embodiment 1 except that the active layer 105 is changed to an active layer 505. The active layer 505 of the semiconductor laser device 500 of the present embodiment is a double quantum well active layer (oscillation wavelength; 410 nm, total thickness: 16 nm) which has a multilayer structure comprising of alternating layers of $In_{b1}Ga_{1-b1}N$ (b1 is about 0.17) well layers (thickness; 2 nm) and $In_{b2}Ga_{1-b2}N$ (b2=0.05) barrier layers (thickness: 4 nm) (barrier layer/well layer/barrier layer/well layer/barrier layer). The active layer 505 of the semiconductor laser device 500 of the present embodiment differs from the active layer 105 of the semiconductor laser device 100 of Embodiment 1 in the thickness of the multilayer structure.

An FFP measurement with the semiconductor laser device of the present embodiment showed a single-peak profile with little ripples (3% or less) as that of Embodiment 1 shown in FIG. 2, and good radiation characteristics were obtained. The semiconductor laser device 500 of the percent embodiment had an oscillation threshold of 25 mA at room temperature and a continuous oscillation operation was confirmed even at 110° C.

As a comparative example, another semiconductor laser device was produced by using GaN as in the conventional semiconductor laser device 1600, instead of InGaN in the guide layer 505 of the semiconductor laser device 500 of the present embodiment. The laser device had FFP characteristics with ripples as those of the FFP 1702 shown in FIG. 17. This indicates that the present embodiment provides a semiconductor laser device having good optical characteristics.

The effective refractive index $n_{eq}$ of the oscillation mode of the semiconductor laser device 500 of the present embodiment was estimated by the above-described method and was shown to be $n_{eq}$=2.543, which is greater than the refractive index $n_{GaN}$ of the GaN layer (2.540). It is believed that this led to the elimination of the vibration component in the electric field in the n-GaN substrate 101, the n-GaN intermediate layer 102, the p-GaN contact layer 109, etc., thereby resulting in good radiation characteristics.

As a variation of the present embodiment, another semiconductor laser device was produced with the active layer being a triple quantum well active layer (oscillation wavelength: 410 nm, total thickness: 22 nm) which has a multilayer structure comprising of alternating layers of $In_{b1}Ga_{1-b1}N$ (b1 is about 0.17) well layers (thickness: 2 nm) and $In_{b2}Ga_{1-b2}N$ (b2=0.05) barrier layers (thickness: 4 nm) (barrier layer/well layer/ . . . /well layer/barrier layer). A single-peak FFP profile with little ripples as that of Embodiment 1 shown in FIG. 2 was obtained, and good radiation characteristics were obtained. The semiconductor laser device had an oscillation threshold of 40 mA at room temperature and a continuous oscillation operation was confirmed even at 100° C. The effective refractive index $n_{eq}$ of the oscillation mode of the semiconductor laser device 500 of the present embodiment was estimated by the above-described method and was shown to be $n_{eq}$=2.545, which is greater than the refractive index $n_{GaN}$ of the GaN layer (2.540). It is believed that this led to the elimination of the vibration component in the electric field in the n-GaN substrate 101, the n-GaN intermediate layer 102, the p-GaN contact layer 109, etc., thereby resulting in good radiation characteristics.

Figure 6:
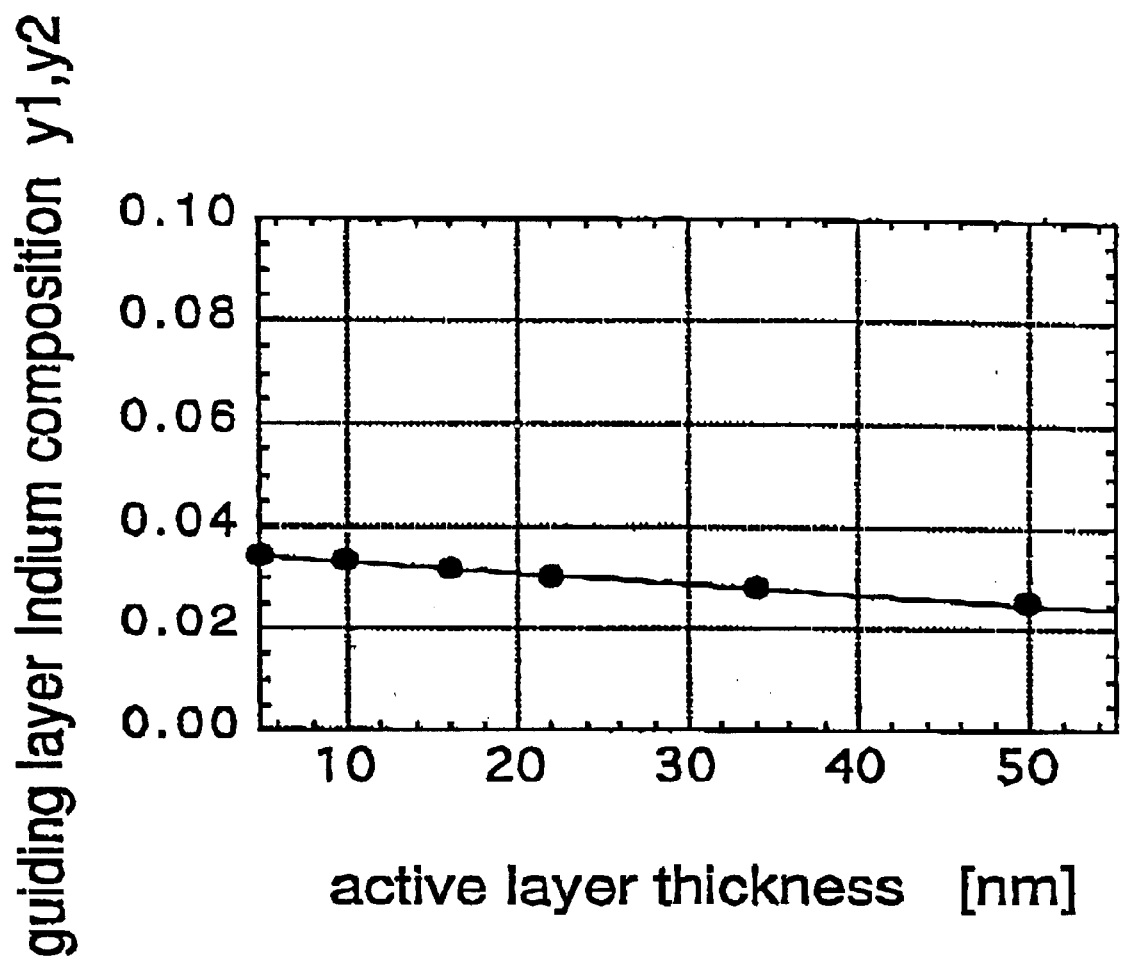
FIG. 6 illustrates conditions for a guide layer which vary as a thickness of an active layer is varied.

Next, the graph of FIG. 6 shows the guide layer In composition y calculated at a point where the effective refractive index $n_{eq}$ exceeds the GaN refractive index $n_{GaN}$ for various total thicknesses of the active layers 505 in the semiconductor laser device 500 of the present embodiment. According to FIG. 6, it can be seen that the conditions for the guide layers 504 and 507, such that the value of the effective refractive index $n_{eq}$ exceeds the value of the GaN refractive index $n_{GaN}$ while the thickness of the active layers 505 is in the range of 10 to 50 nm, are not substantially different from as those for the guide layers of the semiconductor laser device 100 (thickness of active layer: 34 nm) of Embodiment 1 described above (i.e., the In composition of the guide layers 104 and 107 of Embodiment 1 is 0.035, whereas the In composition of the guide layers 504 and 507 obtained from FIG. 6 is 0.035±0.005 while the thickness of the active layer 505 is in the range of 5–60 nm). Strictly speaking, it is necessary to increase the In composition y as the thickness of the active layer 505 is reduced. However, even when the thickness of the active layer 505 is 10 nm, it is only necessary to increase the In composition of the guide layers of Embodiment 1 (0.035) by ±0.005. Moreover, the In composition can be reduced as the thickness of the active layer 505 is increased. However, even when the thickness of the active layer 505 is 50 nm, the In composition can be only about 0.005 less than the In composition of the guide layers of Embodiment 1 (0.035). Since it is difficult in practice to control the composition so precisely, the conditions shown above in connection with the semiconductor laser device 100 of Embodiment 1 can be applied with the thickness of the active layer 505 being in the range of 10–50 nm. More strictly, it can be seen from FIG. 6 that when the thickness of the active layer 505 is in the range of 5–60 nm, the relationship of y≦0.003/d−0.003+(0.007−0.22xWa) can be used, which is obtained by adjusting the conditions represented by curve A of FIG. 4 with the thickness of the active layer 505 (Wa [μm]). It can also be seen from FIG. 6 that for the same reasons as set forth in Embodiment 1, the preferred range can be set to y≦0.003/d+0.002+(0.007−0.22xWa), which is obtained by adjusting the conditions represented by curve A' of FIG. 4 with the thickness of the active layer 505 (Wa [μm]).

With any active layer arrangement, i.e., when both of the uppermost layer and the lowermost layer of the active layer are barrier layers (the <barrier layer/well layer/ . . . /well layer/barrier layer> structure), or when one of the uppermost or lowermost layer of the active layer is a barrier layer with the other one being a well layer (the <barrier layer/well layer/ . . . /barrier layer/well layer> structure), or when both of the uppermost and lowermost layers of the active layers are well layers (the <well layer/barrier layer/ . . . /barrier layer/well layer> structure), the total thickness of all the well and barrier layers can be considered as the active layer thickness Wa. In any case, the relationships shown in the present embodiment are maintained.

When the composition of the active layer was adjusted so that the oscillation wavelength was 380–440 nm (20° C.), the above-described relationships were not changed.

Embodiment 3

Figure 7:
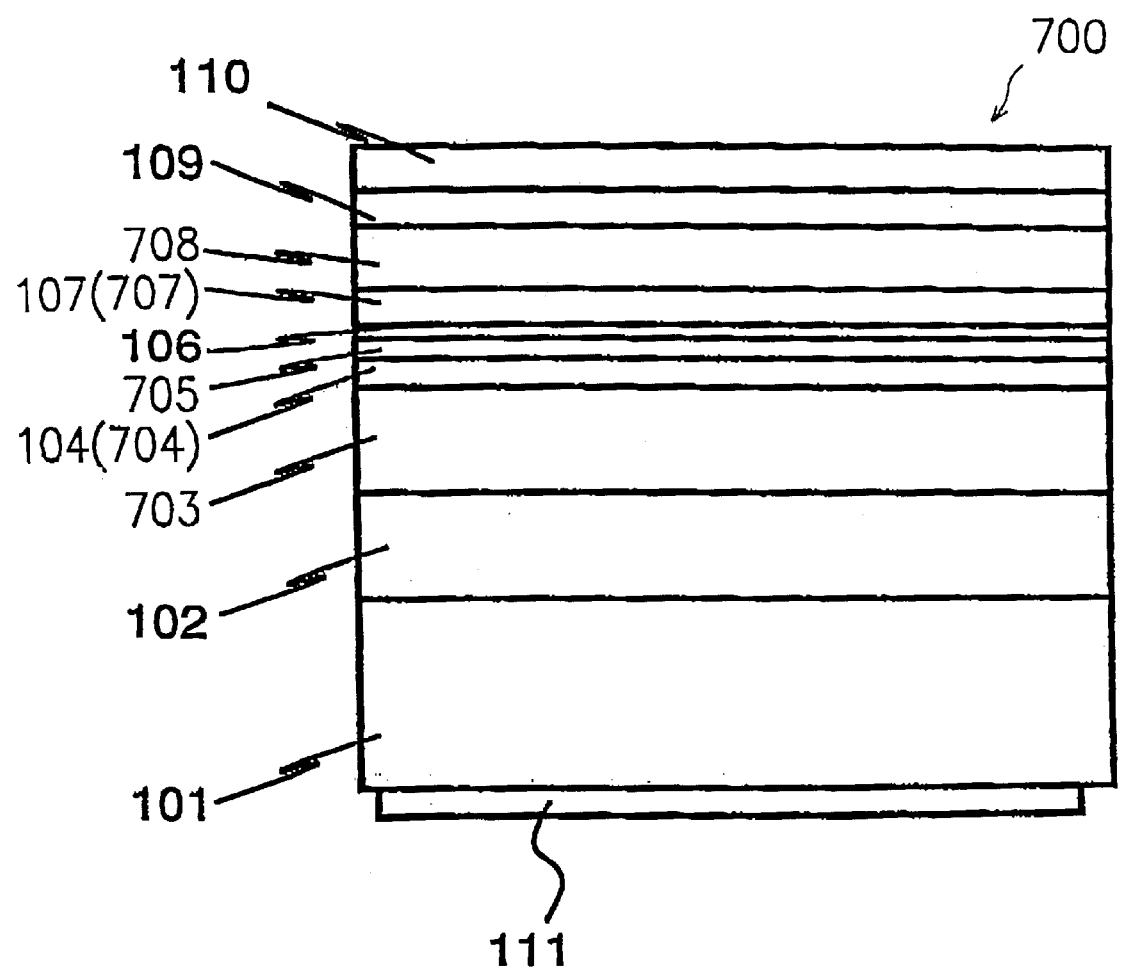
FIG. 7 illustrates a semiconductor laser device according to Embodiment 3 of the present invention.

FIG. 7 illustrates a semiconductor laser device 700 of this embodiment. The semiconductor laser device 700 has the same structure as that of the semiconductor laser device 100 of Embodiment 1 except that the compositions of the upper and lower cladding layers 103 and 108 and the structure of the active layer 105 are changed. An active layer 705 of the semiconductor laser device 700 of the present embodiment is a triple quantum well active layer (oscillation wavelength: 410 nm, total thickness: 22 nm) having a multilayer structure comprising of alternating layers of $In_{b1}Ga_{1-b1}N$ (b1 is about 0.17) well layers (thickness: 2 nm) and $In_{b2}Ga_{1-b2}N$ (b2=0.05) barrier layers (thickness: 4 nm) (barrier layer/well layer/ . . . /well layer/barrier layer). The cladding layers of the semiconductor laser device 700 include an n-$Al_{x1}Ga_{1-x}N$ (x1=0.13) lower cladding layer 703 (thickness: 0.8 μm) and a p-$Al_{x2}Ga_{1-x2}N$ (x2=0.13) upper cladding layer 708 (thickness: 0.5 μm).

An FFP measurement with the semiconductor laser device 700 of the present embodiment showed a single-peak profile with little ripples (3% or less) as that of Embodiment 1 shown in FIG. 2, and good radiation characteristics were obtained. The semiconductor laser device 700 of the present embodiment had an oscillation threshold of 25 mA at room temperature and a continuous oscillation operation was confirmed even at 110° C.

As a comparative example, another semiconductor laser device was produced by using GaN as in the conventional semiconductor laser device 1600, instead of InGaN in the guide layers 104 and 107 of the present embodiment. The laser device had FFP characteristics with ripples as those of the FFP 1702 shown in FIG. 17. This indicates that the present embodiment provides a semiconductor laser device having good optical characteristics.

The effective refractive index $n_{eq}$ of the oscillation mode of the semiconductor laser device 700 of the present embodiment was estimated by the above-described method and was shown to be $n_{eq}$=2.548, which is greater than the refractive index $n_{GaN}$ of the GaN layer (2.540). It is believed that this led to the elimination of the vibration component in the electric field in the n-GaN substrate 701, the n-GaN intermediate layer 702, the p-GaN contact layer 709, etc., thereby resulting in good radiation characteristics.

When the compositions and the thicknesses of the lower cladding layer 703 and the upper cladding layer 708 were changed to n-$Al_{x1}Ga_{1-x1}N$ (x1=0.07) (thickness: 0.8 μm) and p-$Al_{x2}Ga_{1-x2}N$ (x2=0.07) (thickness: 0.5 μm), respectively, a single-peak profile with little ripples (5% or less) as that of Embodiment 1 shown in FIG. 2 was obtained, and good radiation characteristics were obtained. The semiconductor laser device had an oscillation threshold of 70 mA at room temperature. The effective refractive index $n_{eq}$ of the oscillation mode of the semiconductor laser device 700 of the present embodiment was estimated by the above-described method and was shown to be $n_{eq}$=2.542, which is greater than the refractive index $n_{GaN}$ of the GaN layer (2.540). It is believed that this led to the elimination of the vibration component in the electric field in the n-GaN substrate 101, the n-GaN intermediate layer 102, the p-GaN contact layer 109, etc., thereby resulting in good radiation characteristics.

Figure 8:
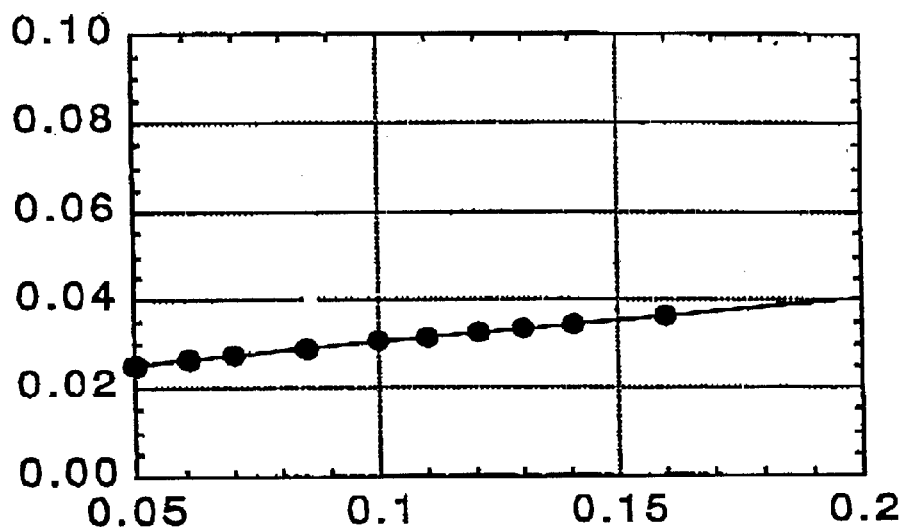
FIG. 8 illustrates conditions for a guide layer which vary as a cladding layer Al composition is varied.

Next, the graph of FIG. 8 shows the guide layer In composition y calculated at a point where the effective refractive index $n_{eq}$ exceeds the GaN refractive index $n_{GaN}$ for various Al compositions of the upper and lower cladding layers 703 and 708 of the semiconductor laser device 700 of the present embodiment. It was assumed that x1=x2 for the sake of simplicity. According to FIG. 8, it can be seen that the conditions for the guide layers 704 and 707, such that a value of the effective refractive index $n_{eq}$ exceeds the value of the GaN refractive index $n_{GaN}$ while the Al composition is in the range of 0.055 to 0.145, are not substantially different from those for the case where the Al composition of the cladding layers 013 and 108 is 0.1 (Embodiments 1 and 2) (i.e., the In composition of the guide layers 104 and 107 of Embodiment 1 is 0.035, whereas the In composition of the guide layers 704 and 707 is 0.035±0.005). Strictly speaking, it is necessary to increase the In composition y as the Al composition of the cladding layer is increased. However, even when the Al composition of the cladding layer is 0.145 it is only necessary to increase the In composition of the guide layers of Embodiment 1 (0.035) by +0.005. Moreover, the In composition can be reduced as the Al composition of the cladding layer is reduced. However, even when the Al composition of the cladding layer is 0.055, the In composition can be only about 0.005 less than the In composition of the guide layers of Embodiment 1. Since it is difficult in practice to control the composition so precisely, the conditions shown above in connection with the semiconductor laser device 100 of Embodiment 1 can be applied with the Al cladding layer composition being in the range of 0.055 to 0.145. While the respective compositions of the upper and lower cladding layers are the same in the case of FIG. 8, the present invention is not limited to this. Since the obtained results are substantially the same as long as the Al composition of each cladding layer is in the range of 0.055 to 0.145, as can be seen from FIG. 8, the compositions of the upper and lower cladding layers 703 and 707 may be changed as desired within this range.

More strictly, it can be seen from FIG. 8 that when the Al composition x of the cladding layer is 0.05≦x≦0.2, the relationship of y≧0.003/d−0.003+(−0.010+0.10 xx) can be used, which is obtained by adjusting the conditions represented by curve A of FIG. 4 with the Al composition x of the cladding layer. It can also be seen from FIG. 8 that for the same reasons as set forth in Embodiment 1, the preferred range can be set to y≧0.003/d+0.002+(−0.010+0.10xx), which is obtained by adjusting the conditions represented by curve A' of FIG. 4 with the Al composition x of the cladding layer. In these expressions, the Al composition x can be calculated as a simple average of the respective Al compositions of the upper and lower cladding layers x1 and x2 ((x1+x2)/2), if x1 and x2 are different from each other.

Even when the AlGaN cladding layer is a so-called "superlattice" cladding layer comprising of alternating layers of various thin AlGaN layers having different compositions, the oscillation mode is not influenced as long as the alternating thin layers are provided with a pitch which is less than or equal to about 30 nm. Therefore, each of the compositions x1 and x2 of the cladding layers can be calculated as an average composition of the alternating thin layers, and the relationships shown above can be applied as they are.

With semiconductor laser devices having such a structure, the thickness of each cladding layer was changed to various thicknesses. It was not necessary to change above-described conditions as long as the thickness of the cladding layer 703 was 0.6 μm or more. For the cladding layer 708, the above-described conditions were not changed as long as the thickness of the cladding layer 708 was 0.3 μm or more.

Moreover, the relationships shown above did not change when the composition of the active layer 705 was adjusted so as to have an oscillation wavelength in the range of 380–440 (nm (20° C.).

Embodiment 4

Figure 9:
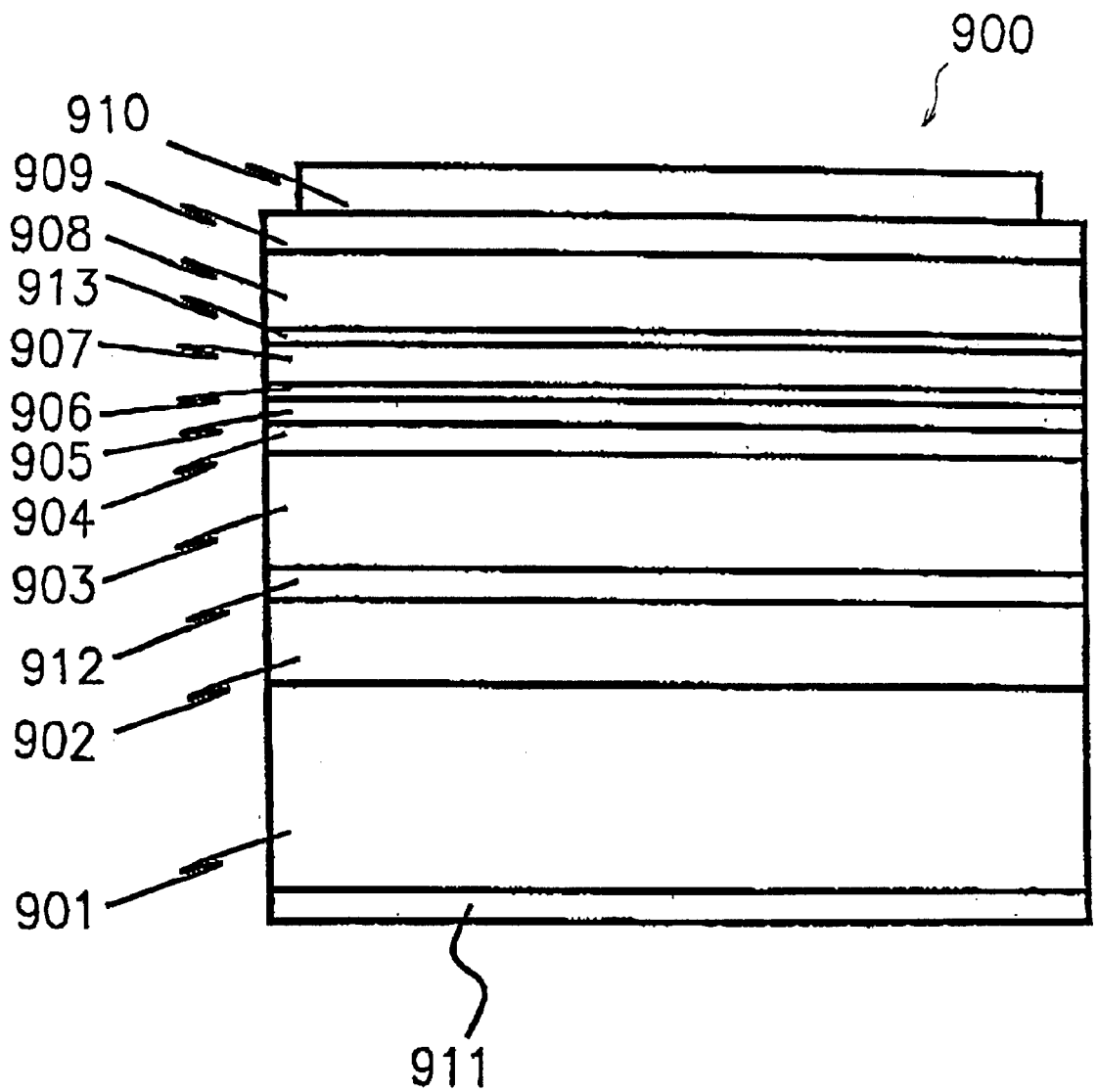
FIG. 9 illustrates a semiconductor laser device according to Embodiment 4 of the present invention.

FIG. 9 shows a schematic diagram of a semiconductor laser device 900 of this embodiment, which is a variation of the semiconductor laser device 100 of Embodiment 1. The semiconductor laser device 900 includes an n-GaN substrate 901 (thickness: 70 μm). The semiconductor laser device 900 further includes: an n-GaN first intermediate layer 902 (thickness: 4 μm); and n-In$_c$Ga$_{1-c}$N (c=0.07) second intermediate layer 912 (thickness: 0.05 μm); an n-Al$_{x1}$Ga$_{1-x1}$N (x1=0.1) lower cladding layer 903 (thickness: 0.7 μm); an n-In$_{y1}$Ga$_{1-y1}$N (y1=0.035) lower guide layer 904 (thickness: 0.1 μm); a quintuple quantum well active layer 905 (oscillation wavelength: 410 nm; total thickness: 34 nm) having a multilayer structure comprising of alternating layers of In$_{b1}$Ga$_{1-b1}$N (b1 is about 0.17) well layers (thickness: 2 nm) and In$_{b2}$Ga$_{1-b2}$N (b2=0.05) barrier layers (thickness: 4 nm) (barrier layer/well layer/ . . . /well layer/barrier layer); a p-Al$_z$Ga$_{1-z}$N (z=0.2) lower cap layer 906 (thickness: 18 nm); a p-In$_{y2}$Ga$_{1-y2}$N (y2=0.035) upper guide layer 907 (thickness: 0.1 μm); a p-Al$_{z1}$Ga$_{1-z1}$N (z1=0.2) upper cap layer 913 (thickness: 5 nm); a p-Al$_{x2}$Ga$_{1-x2}$N (x2=0.1) upper cladding layer 908 (thickness: 0.5 μm); and a p-GaN contact layer 909 (thickness: 0.1 μm). These layers are deposited in this order on the n-GaN substrate 901. In the present embodiment, the n-In$_o$Ga$_{1-c}$N second intermediate layer 912 which is provided under the lower cladding layer 903 has a function of preventing a crack from being introduced into the stack structure. In the present embodiment, the p-Al$_{z1}$Ga$_{1-z1}$N (z1=0.2) upper cap layer 913 is provided on the upper guide layer 907 for preventing the In-containing guide layer 907 from being evaporated and deteriorated during the laser structure deposition process.

An FFP measurement with the semiconductor laser device 900 of the present embodiment showed a single-peak profile with little ripples (10% or less) as that of Embodiment 1 shown in FIG. 2, and good radiation characteristics were obtained. The semiconductor laser device 900 of the present embodiment had an oscillation threshold of 55 mA at room temperature and a continuous oscillation operation was confirmed even at 80° C.

As a comparative example, another semiconductor laser device was produced by using GaN as in the conventional semiconductor laser device 1600, instead of InGaN in the guide layers 904 and 907 of the present embodiment. The laser device had FFP characteristics with ripples as those of the FFP 1702 shown in FIG. 17. This indicates that the present embodiment provides a semiconductor laser device having good optical characteristics.

The effective refractive index n$_{eq}$ of the oscillation mode of the semiconductor laser device 900 of the present embodiment was estimated by the above-described described method and was shown to be n$_{eq}$=2.547, which is equal to the value obtained with the semiconductor laser device 100 of Embodiment 1 where the n-In$_c$Ga$_{1-c}$N intermediate layer 912 is not provided outside the cladding layers. This is because the oscillating mode is substantially determined by the structure of the device between the upper and lower cladding layers 903 and 908, and thus the effective refractive index n$_{eq}$ is not substantially influenced by such an intermediate layer. The conditions shown in Embodiments 1 to 3 where the value of the effective refractive index n$_{eq}$ exceeds the value of the GaN refractive index n$_{GaN}$ did not change even when a crack-preventing layer (an InGaN layer having a thickness of 0.1 μm or less) was provided as in the present embodiment. Moreover, the effective refractive index n$_{eq}$ was equal to that obtained in Embodiment 1 where the p-Al$_{z1}$Ga$_{1-z1}$N (z1=0.2) upper cap layer 913 is not provided between the upper guide layer 907 and the upper cladding layer 908. This is because the p-Al$_{z1}$Ga$_{1-z1}$N (z1=0.2) upper cap layer 913 has a small thickness which is less than or equal to 20 nm and thus does not substantially influence the value of the effective refractive index n$_{eq}$. The conditions shown in Embodiments 1 to 3 such that the value of the effective refractive index n$_{eq}$ exceeds the value of the GaN refractive index n$_{GaN}$ did not change even when a crack-preventing layer (an InGaN layer having a thickness of 0.1 μm or less) was provided as in the present embodiment.

Embodiment 5

Figure 10:
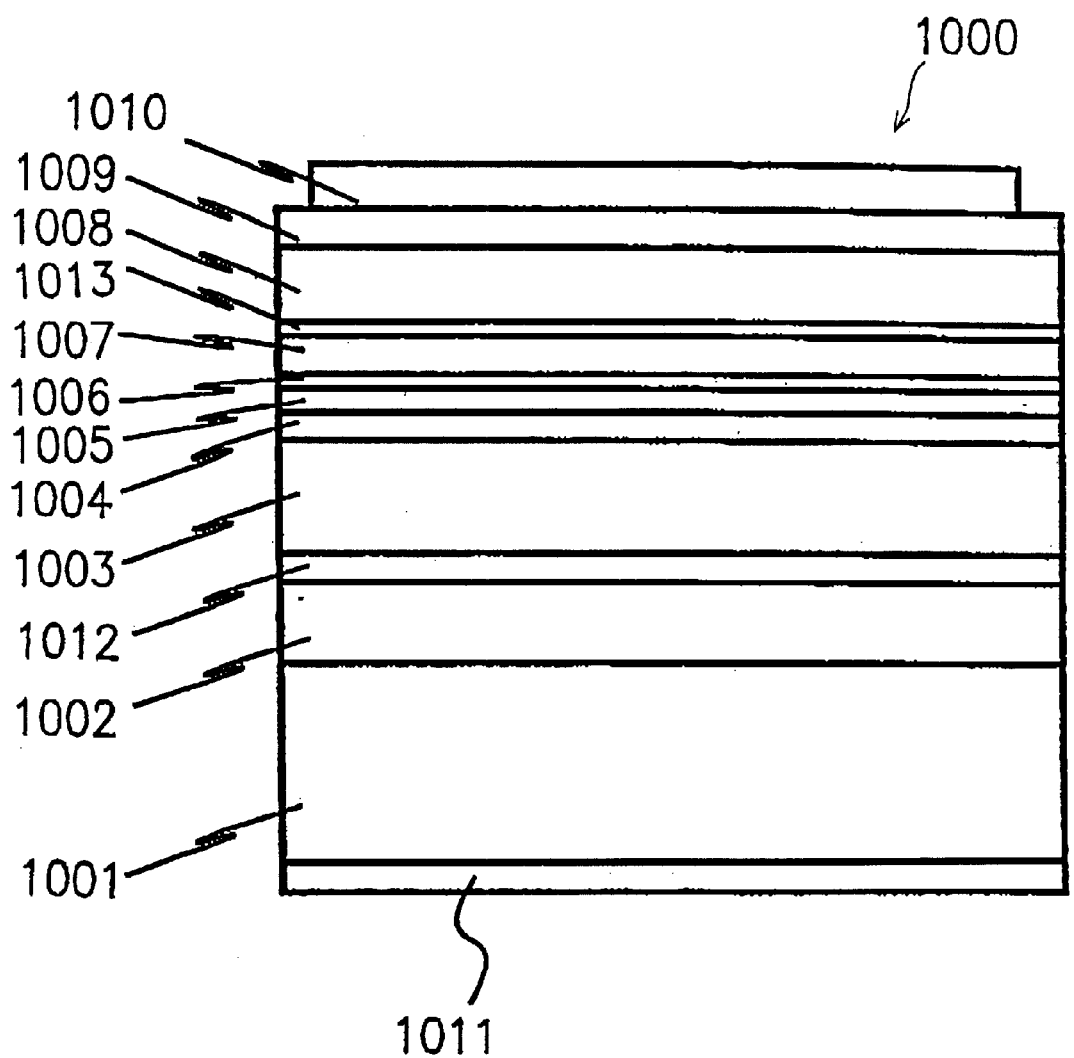
FIG. 10 illustrates a semiconductor laser device according to Embodiment 5 of the present invention.

FIG. 10 illustrates a semiconductor laser device 1000 of this embodiment. The semiconductor laser device 1000 is structurally similar to the semiconductor laser device 900 shown in the schematic diagram of FIG. 9, but the respective layers therein have different thicknesses and/or compositions from those of the semiconductor laser device 900. The semiconductor laser device 1000 includes: an n-GaN substrate 1001 (thickness: 30–300 μm); an n-GaN first intermediate layer 1002 (thickness: 0–30 μm); an n-In$_c$Ga$_{1-c}$N (0.01≦c≦0.2) second intermediate layer 1012 (thickness: 0–0.1 μm); an n-Al$_{x1}$Ga$_{1-x1}$N (0.05≦x1≦0.2) lower cladding layer 1003 (thickness: 0.6–10 μm); an n-In$_{y1}$Ga$_{1-y1}$N (y1≦b1) lower guide layer 1004 (thickness: d1 [μm]); a quantum well active layer 1005 (oscillation wavelength: 370–440 nm, total thickness: Wa [μm]) having a multilayer structure comprising of alternating layers of In$_{b1}$Ga$_{1-b1}$N well layers and In$_{b2}$Ga$_{1-b2}$N (b2<b1) barrier layers; an Al$_{z1}$Ga$_{1-z1}$N (0≦z1≦0.3) lower cap layer 1006 (thickness: 0–50 nm); a p-In$_{y2}$Ga$_{1-y2}$N (y2≦b1) upper guide layer 1007 (thickness: d2 [μm]); a p-Al$_{z1}$Ga$_{1-z1}$N (0≦z1≦0.3) upper cap layer 1013 (thickness: 0–50 nm); a p-Al$_{x2}$Ga$_{1-x2}$N (0.05≦x2≦0.2) upper cladding layer 1008 (thickness: 0.4–10 μm); and a p-GaN contact layer 1009 (thickness: 0–10 μm). Herein, the following relationships are satisfied: d=(d1+d2)/2, y=(y1×d1+y2×d2)/(d1+d2), x=(x1+x2)/2, 5≦Wa≦60, and y≧0.003/d−0.003+(0.007−0.22×Wa)+(−0.010+0.10×x).

An FFP measurement with the semiconductor laser device 1000 of the present embodiment showed a single-peak profile with little ripples as that of Embodiment 1 shown in FIG. 2, and good radiation characteristics were obtained.

Moreover, the composition and the thickness of the guide layer are preferably limited so as to satisfy the relationship of $y \geq 0.003/d + 0.002 + (0.007 - 0.22 \times Wa) + (-0.010 + 0.10 \times x)$. In such a case, it is possible to prevent a device whose FFP has ripples in the vicinity of the optical axis from being produced on a wafer for the same reasons as set forth in Embodiment 1.

Embodiment 6

Figure 11:
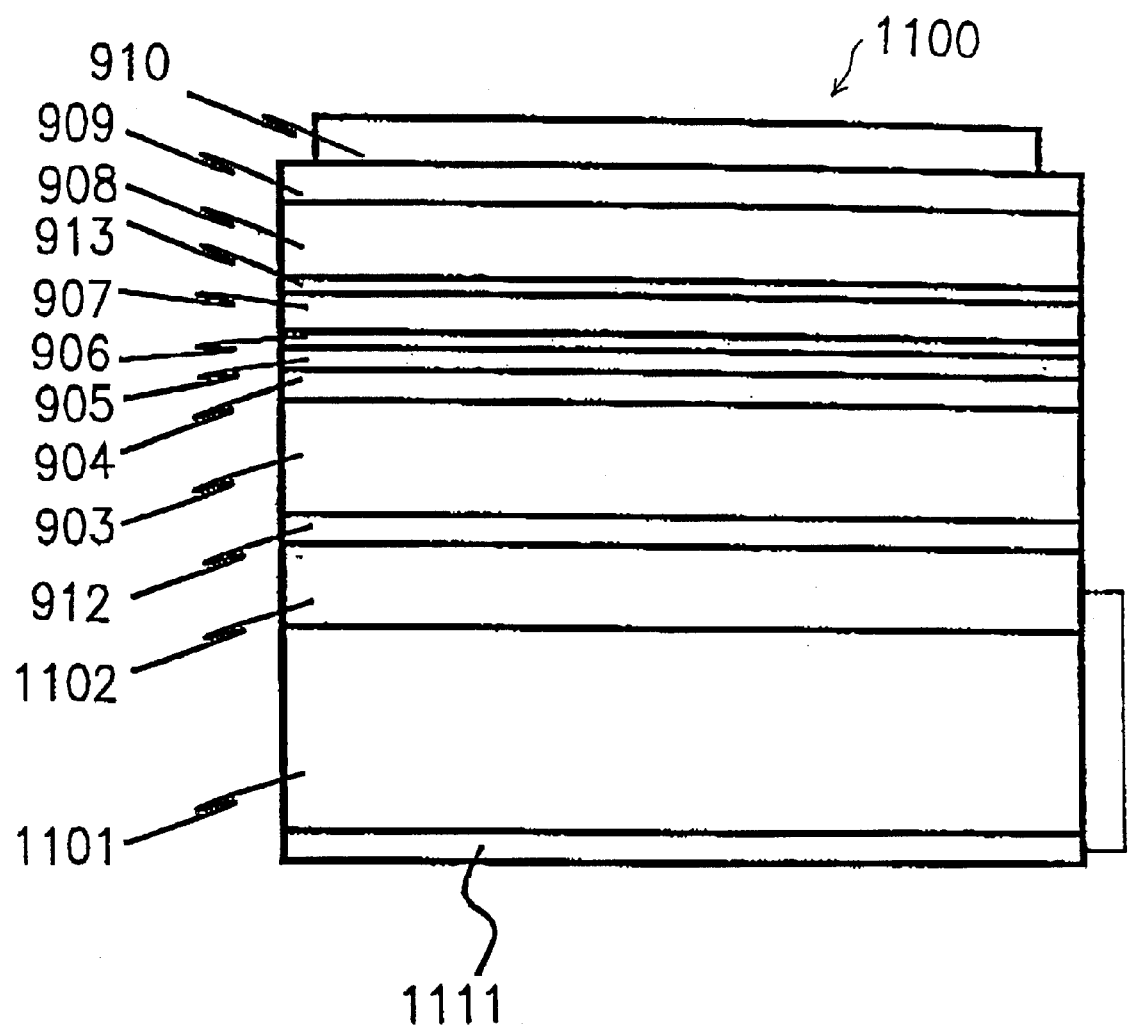
FIG. 11 illustrates a semiconductor laser device according to Embodiment 6 of the present invention.

FIG. 11 illustrates a semiconductor laser device 1100 of this embodiment, which is a variation of the semiconductor laser device 900 of Embodiment 4. The semiconductor laser device 1100 is the same as the semiconductor laser device 900 except that the semiconductor laser device 1100 employs a sapphire substrate 1101 (thickness: 60 μm) instead of the n-GaN substrate 901 (thickness: 70 μm), and that an electrode 1111 is connected to an n-GaN intermediate layer 1102.

An FFP measurement with the semiconductor laser device 1100 of the present embodiment showed a single-peak profile as that of Embodiment 1 shown in FIG. 2 with no ripples, and good radiation characteristics were obtained. However, for some devices, ripples of an intensity of about 20% were observed. This is because an interface such as a sapphire/GaN interface at which the refractive index changes greatly exists in the vicinity of the waveguide and causes reflection. Moreover, due to variations characteristics in the thickness of the n-GaN layer, the coupling condition between the reflection surface and the waveguide slightly varies for different devices, whereby slight ripples occur in worst cases. However, if the guide layer conditions are set to those shown in Embodiments 1 to 3, the optical characteristics are significantly improved from those obtained when GaN is used for the guide layers as in the prior art. Moreover, on average, FFP characteristics with little ripples can be obtained. Thus, the effects of the present invention were confirmed even when a sapphire substrate is used as in the present embodiment. A sapphire substrate can also be used in the semiconductor laser devices of Embodiments 1, 2, 3 and 5, and similar effects as those described above have been confirmed in such cases.

Embodiment 7

Figure 12:
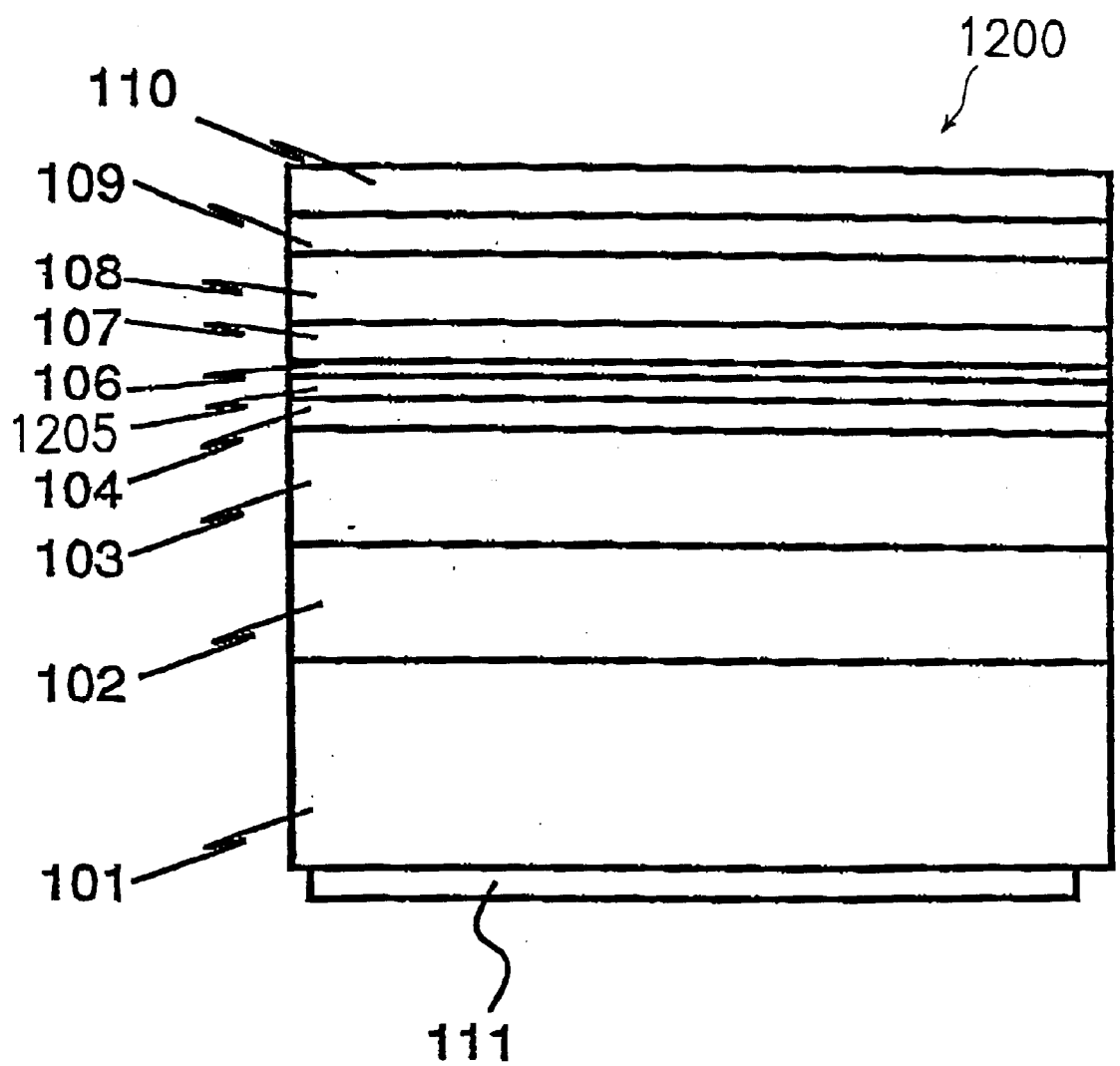
FIG. 12 illustrates a semiconductor laser device according to Embodiment 7 of the present invention.

FIG. 12 illustrates a semiconductor laser device 1200 of this embodiment. The semiconductor laser device 1200 has the same structure as that of Embodiment 1 except that a triple quantum well active layer 1205 (oscillation wavelength: 400 nm, total thickness: 16 nm) having a multilayer structure comprising of alternating layers of $GaN_{1-e1}P_{e1}$ (e1 is about 0.03) well layers (thickness: 2 nm) and $GaN_{1-e2}P_{e2}$ (e2 is about 0.01) barrier layers (thickness: 4 nm) was used instead of the active layer 105 of the semiconductor laser device 100 of Embodiment 1. The semiconductor laser device 1200 of the present embodiment had good optical characteristics as in Embodiment 1. Moreover, within an oscillation wavelength range of 360–550 nm, similar effects were obtained even when the composition of the active layer 1205 was slightly varied.

Embodiment 8

Figure 13:
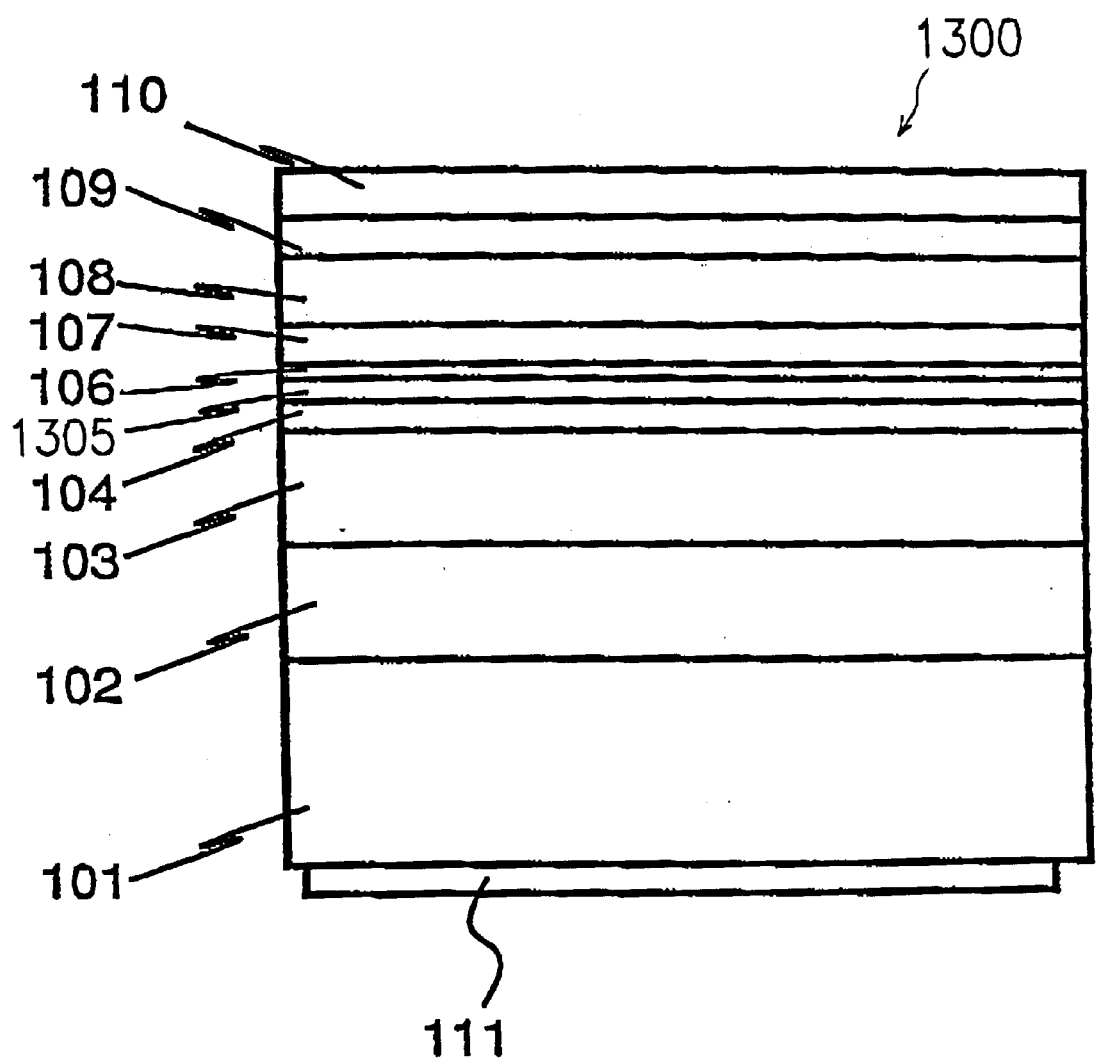
FIG. 13 illustrates a semiconductor laser device according to Embodiment 8 of the present invention.

FIG. 13 illustrates a semiconductor laser device 1300 of this embodiment. The semiconductor laser device 1300 has the same structure as that of Embodiment 1 except that a double quantum well active layer 1305 (oscillation wavelength: 440 nm, total thickness; 21 nm) having a multilayer structure comprising of alternating layers of $GaN_{1-e2}As_{e2}$ (e2 is about 0.02) well layers (thickness: 3 nm) and $In_{b2}Ga_{1-b2}N$ (b2 is about 0.05) barrier layers (thickness: 5 nm) was used instead of the active layer 105 of the semiconductor laser device 100 of Embodiment 1. The semiconductor laser device 1300 of the present embodiment had good optical characteristics as in Embodiment 1. Moreover, within an oscillation wavelength range of 360–550 nm, similar effects were obtained even when the composition of the active layer 1305 was slightly varied.

Embodiment 9

Figure 14:
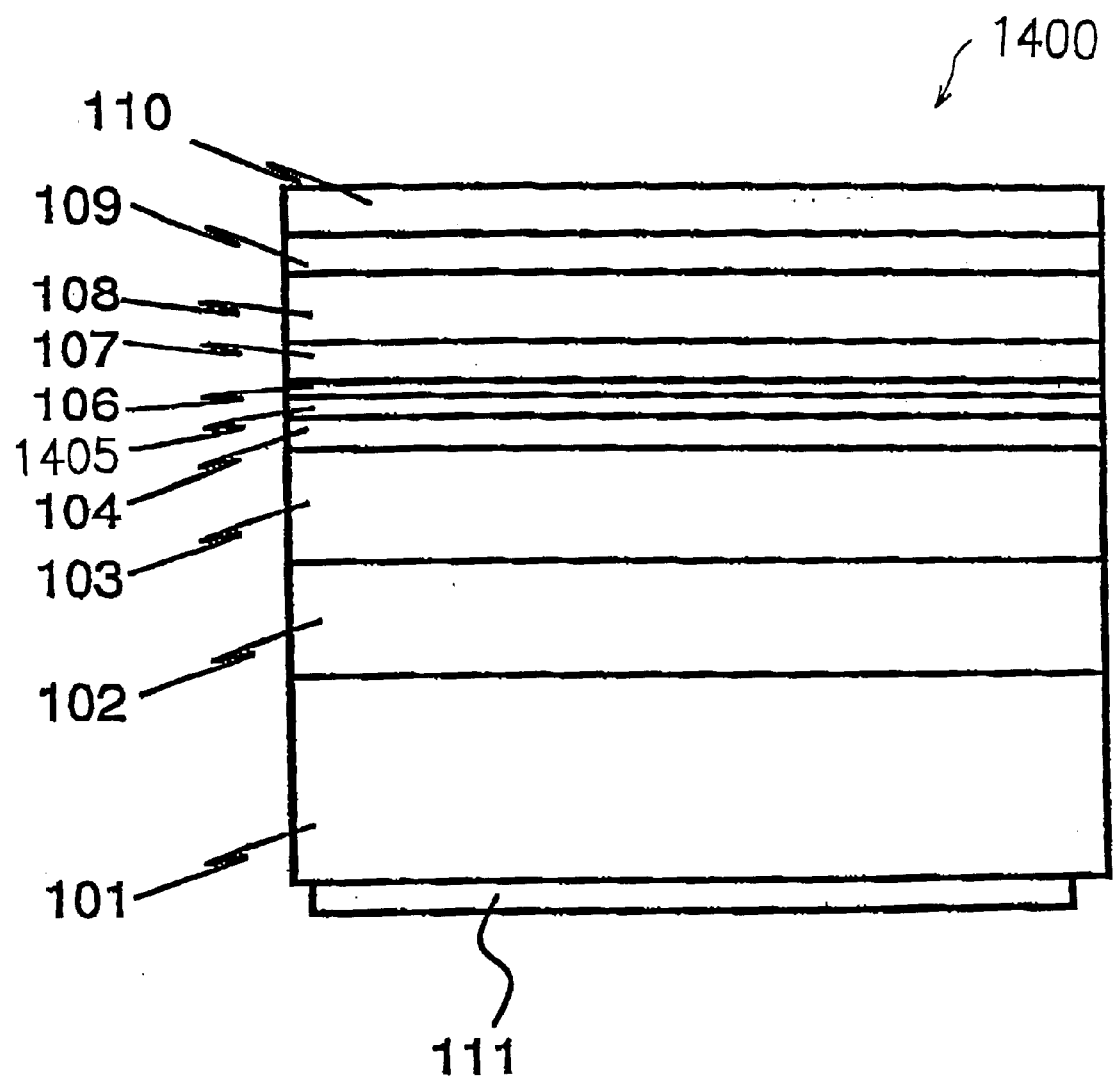
FIG. 14 illustrates a semiconductor laser device according to Embodiment 9 of the present invention.

FIG. 14 illustrates a semiconductor laser device 1400 of this embodiment. The semiconductor laser device 1400 has the same structure as that of Embodiment 1 except that an active layer 1405 (oscillation wavelength: 360–550 nm, total thickness; 5–50 nm) having a multilayer structure comprising of alternating layers of $Al_{a1}In_{b1}Ga_{1-a1-b1}N_{1-e1-f1}P_{e1}As_{f1}$ ($0 \leq a1$, $0 \leq b1$, $a1+b1 \leq 1$, $0 \leq e1$, $0 \leq f1$, $e1+f1<0.5$) well layers and $Al_{a2}In_{b2}Ga_{1-a2-b2}N_{1-e2-f2}P_{e2}As_{f2}$ ($0 \leq a2$, $0 \leq b2$, $a2+b2 \leq 1$, $0 \leq e2$, $0 \leq f2$, $e2+f2<0.5$) barrier layers was used instead of the active layer 105 of the semiconductor laser device 100 of Embodiment 1. The semiconductor laser device 1400 of the present embodiment had good optical characteristics as in Embodiment 1.

While an InGaN material is used in each of the upper and lower guide layers in the embodiments described above, the present invention is not limited to this. Alternatively, other materials may be used which contain an element other than In (e.g., As, P, Tl) which, when added to GaN, increases the refractive index. Thus, the guide layers can be made of GaNAs, GaNP, GaNPAs, InGaNAs, InGaNP, InGaNPAs, TlGaN, TlInGaN, or the like. When employing GaNAs, effects similar to those described above can be obtained by setting the As composition to be ⅙ of the In composition shown above in each embodiment. When employing GaNP, effects similar to those described above can be obtained by setting the P composition to be ¼ of the In composition shown above in each embodiment.

Moreover, it should be apparent to those skilled in the art that a semiconductor laser device of the present invention can also be obtained by combining two or more of the embodiments described above.

Embodiment 10

Figure 15:
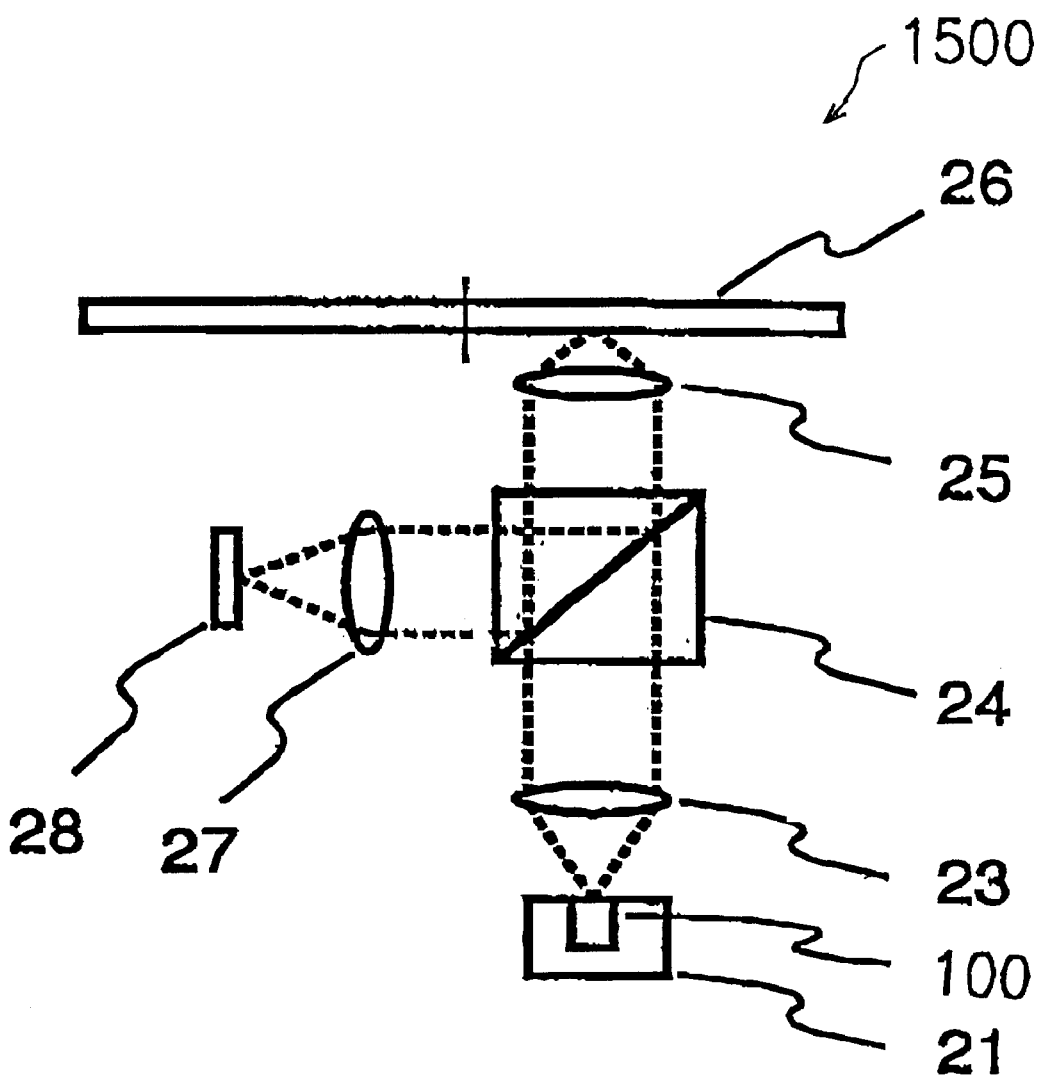
FIG. 15 illustrates an optical information reproduction apparatus of the present invention.

FIG. 15 illustrates an optical information reproduction apparatus 1500 of this embodiment. The optical information reproduction apparatus 1500 includes a base plate 21, the semiconductor laser device 100 of Embodiment 1 mounted on the base plate 21, a collimator lens 23, a beam splitter 24, an objective lens 25, an optical disk 26, a lens 27 for focusing reflected light, and a photodetector 28 for detecting the focused light. In the optical information reproduction apparatus 1500, laser light is emitted from the semiconductor laser device 100 and then converted by the collimator lens 23 into parallel or generally parallel light. The light passes through the beam splitter 24 and is focused onto the information recording surface of the optical disk 26 by the objective lens 25. Bit information is recorded on the information recording surface of the optical disk 26 in the form of concave/convex portions or by magnetic modulation or refractive index modulation. The focused laser light is reflected by the information recording surface, passes through the objective lens 25 and is split through the beam splitter 24. Then, the reflected light is focused onto the photodetector 28 by the focusing lens 27. At the photodetector 28, optically detected signals are converted into electric signals, thereby reproducing the recorded information.

The semiconductor laser device 100 having good optical characteristics in which ripples in the FFP are suppressed was employed in the optical information reproduction apparatus 1500. Therefore, light was focused by the objective lens 25 onto the information recording surface characteristics of the optical disk 26 with a high resolution. As a result, it was possible to reproduce the recorded information with a low bit error rate of $10^{-6}$ from the optical disk 26 whose recording density was as high as 5 M/mm².

As a comparative example, another optical information reproduction apparatus was produced while a semiconductor laser device in which the guide layers were made of GaN as in the conventional semiconductor laser device 1600 was employed instead of the semiconductor laser device 100 as shown in FIG. 15. Under the same conditions as described above, the optical information reproduction apparatus had a high bit error rate of $10^{-3}$. Such an optical information reproduction apparatus is not suitable for practical use. Thus, it was confirmed that with the optical information reproduction apparatus 1500 of the present embodiment, capable of reproducing information characteristics with a low error rate from an optical disk having a high recording density, it is possible to focus light onto an optical disk with a high resolution.

Moreover, the semiconductor laser device 100 in the optical information reproduction apparatus 1500 of the present embodiment was replaced with other semiconductor laser devices of Embodiments 2 to 9. With each of the semiconductor laser devices of Embodiments 2 to 9, a low bit error rate of $10^{-5}$ to $10^{-7}$ was achieved under the conditions as described above. Thus, it was confirmed that with any of the semiconductor laser devices of the present invention, it is possible to focus light onto an optical disk with a high resolution.

According to the present invention, in a semiconductor laser device using a gallium nitride semiconductor, parameters (e.g., the thickness and the composition) of guide layers are optimized so as to provide a semiconductor laser device having good optical characteristics capable of realizing a single-peak far field pattern in which ripples are suppressed. Moreover, according to the present invention, such a semiconductor laser device is employed in an optical information reproduction apparatus so that it is possible to focus light with a high resolution and thus to reproduce an optical disk having a high recording density.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device, comprising, in this order:
   a GaN layer;
   an $Al_{x1}Ga_{1-x1}N$ ($0.05 \leq x1 \leq 0.2$) lower cladding layer;
   an $In_{y1}Ga_{1-y1}N$ ($0<y1<1$) lower guide layer (thickness: d1 [$\mu$m]);
   an active layer (thickness: Wa [$\mu$m]) having a multilayer structure comprising of alternating layers of a well layer and a barrier layer, the well layer comprising $Al_{a1}In_{b1}Ga_{1-a1-b1}N_{1-e1-f1}P_{e1}As_{f1}$ ($0 \leq a1$, $0 \leq b1$, $a1+b1 \leq 1$, $0 \leq e1$, $0 \leq f1$, $e1+f1<0.5$), and the barrier layer comprising $Al_{a2}In_{b2}Ga_{1-a2-b2}N_{1-e2-f2}P_{e2}As_{f2}$ ($0 \leq a2$, $0 \leq b2$, $a2+b2 \leq 1$, $0 \leq e2$, $0 \leq f2$, $e2+f2<0.5$);
   an $In_{y2}Ga_{1-y2}N$ ($0<y2<1$) upper guide layer (thickness: d2 [$\mu$m]); and
   an $Al_{x2}Ga_{1-x2}N$ ($0.05 \leq x2 \leq 0.2$) upper cladding layer, wherein:
   the thicknesses and the compositions of the lower guide layer and the upper guide layer are set such that ripples in a far field pattern in a direction perpendicular to a stack plane are suppressed.

2. An optical information reproduction apparatus for reproducing information recorded on an optical disk having an information recording surface by irradiating the optical disk with laser light and photoelectrically converting the laser light reflected from the optical disk, wherein the optical information reproduction apparatus uses a semiconductor laser device according to claim 1 as a light source.

3. A semiconductor laser device, comprising, in this order:
   a GaN layer;
   an $Al_{x1}Ga_{1-x1}N$ ($0.05 \leq x1 \leq 0.2$) lower cladding layer;
   an $In_{y1}Ga_{1-y1}N$ ($0<y1<1$) lower guide layer (thickness: d1 [$\mu$m]);
   an active layer (thickness: Wa [$\mu$m]) having a multilayer structure comprising of alternating layers of a well layer and a barrier layer, the well layer comprising $Al_{a1}In_{b1}Ga_{1-a1-b1}N_{1-e1-f1}P_{e1}As_{f1}$ ($0 \leq a1$, $0 \leq b1$, $a1+b1 \leq 1$, $0 \leq e1$, $0 \leq f1$, $e1+f1<0.5$), and the barrier layer comprising $Al_{a2}In_{b2}Ga_{1-a2-b2}N_{1-e2-f2}P_{e2}As_{f2}$ ($0 \leq a2$, $0 \leq b2$, $a2+b2 \leq 1$, $0 \leq e2$, $0 \leq f2$, $e2+f2<0.5$);
   an $In_{y2}Ga_{1-y2}N$ ($0<y2<1$) upper guide layer (thickness: d2 [$\mu$m]); and
   an $Al_{x2}Ga_{1-x2}N$ ($0.05 \leq x2 \leq 0.2$) upper cladding layer, wherein:
   the thicknesses and the compositions of the lower guide layer and the upper guide layer are set such that an oscillating mode effective refractive index $n_{eq}$ of oscillation light from the semiconductor laser device and a refractive index $n_{GaN}$ of the GaN layer have a relationship of $n_{eq} \geq n_{GaN}$.

4. An optical information reproduction apparatus for reproducing information recorded on an optical disk having an information recording surface by irradiating the optical disk with laser light and photoelectrically converting the laser light reflected from the optical disk, wherein the optical information reproduction apparatus uses a semiconductor laser device according to claim 3 as a light source.

5. A semiconductor laser device, comprising, in this order:
   a GaN layer;
   an $Al_{x1}Ga_{1-x1}N$ ($0.05 \leq x1 \leq 0.2$) lower cladding layer;
   an $In_{y1}Ga_{1-y1}N$ ($0<y1<1$) lower guide layer (thickness: d1 [$\mu$m]);
   an active layer (thickness: Wa [$\mu$m]) having a multilayer structure comprising of alternating layers of a well layer and a barrier layer, the well layer comprising $Al_{a1}In_{b1}Ga_{1-a1-b1}N_{1-e1-f1}P_{e1}As_{f1}$ ($0 \leq a1$, $0 \leq b1$, $a1+b1 \leq 1$, $0 \leq e1$, $0 \leq f1$, $e1+f1<0.5$), and the barrier layer comprising $Al_{a2}In_{b2}Ga_{1-a2-b2}N_{1-e2-f2}P_{e2}As_{f2}$ ($0 \leq a2$, $0 \leq b2$, $a2+b2 \leq 1$, $0 \leq e2$, $0 \leq f2$, $e2+f2<0.5$);
   an $In_{y2}Ga_{1-y2}N$ ($0<y2<1$) upper guide layer (thickness: d2 [$\mu$m]); and
   an $Al_{x2}Ga_{1-x2}N$ ($0.05 \leq x2 \leq 0.2$) upper cladding layer, wherein:
   the thicknesses and the compositions of the lower guide layer and the upper guide layer are set so as to satisfy one of the following relationships:

$0.06 \leq d1+d2 \leq 0.1$ and $0.06 \leq y1$, $0.06 \leq y2$;

$0.1 < d1+d2 \leq 0.15$ and $0.04 \leq y1$, $0.04 \leq y2$;

$0.15 < d1+d2 \leq 0.2$ and $0.03 \leq y1$, $0.03 \leq y2$;

$0.2 < d1+d2 \leq 0.3$ and $0.015 \leq y1$, $0.015 \leq y2$; and $0.3 < d1+d2$ and $0.01 \leq y1$, $0.01 \leq y2$.

6. An optical information reproduction apparatus for reproducing information recorded on an optical disk having an information recording surface by irradiating the optical disk with laser light and photoelectrically converting the laser light reflected from the optical disk, wherein the optical information reproduction apparatus uses a semiconductor laser device according to claim 5 as a light source.

7. A semiconductor laser device, comprising, in this order:

a GaN layer;

an $Al_{x1}Ga_{1-x1}N$ ($0.05 \leq x1 \leq 0.2$) lower cladding layer;

an $In_{y1}Ga_{1-y1}N$ ($0<y1<1$) lower guide layer (thickness: d1 [μm]);

an active layer (thickness: Wa [μm]) having a multilayer structure comprising of alternating layers of a well layer and a barrier layer, the well layer comprising $Al_{a1}In_{b1}Ga_{1-a1-b1}N_{1-e1-f1}P_{e1}As_{f1}$ ($0 \leq a1$, $0 \leq b1$, $a1+b1 \leq 1$, $0 \leq e1$, $0 \leq f1$, $e1+f1<0.5$), and the barrier layer comprising $Al_{a2}In_{b2}Ga_{1-a2-b2}N_{1-e2-f2}P_{e2}As_{f2}$ ($0 \leq a2$, $0 \leq b2$, $a2+b2 \leq 1$, $0 \leq e2$, $0 \leq f2$, $e2+f2<0.5$);

an $In_{y2}Ga_{1-y2}N$ ($0<y2<1$) upper guide layer (thickness: d2 [μm]); and an $Al_{x2}Ga_{1-x2}N$ ($0.05 \leq x2 \leq 0.2$) upper cladding layer, wherein:

the thicknesses and the compositions of the lower guide layer and the upper guide layer are set so as to satisfy the following relationships:

$$y \geq 0.003/d - 0.003 + (0.007 - 0.22 \times Wa) + (-0.010 + 0.10 \times x).$$

8. An optical information reproduction apparatus for reproducing information recorded on an optical disk having an information recording surface by irradiating the optical disk with laser light and photoelectrically converting the laser light reflected from the optical disk, wherein the optical information reproduction apparatus uses a semiconductor laser device according to claim 7 as a light source.

9. A semiconductor laser device, comprising:

a GaN layer;

an $Al_{x1}Ga_{1-x1}N$ ($0.05 \leq x1 \leq 0.2$) lower cladding layer;

an $In_{y1}Ga_{1-y1}N$ ($0<y1<1$) lower guide layer;

an active layer having a multilayer structure comprising of alternating layers of a well layer and a barrier layer, the well layer comprising $Al_{a1}In_{b1}Ga_{1-a1-b1}N_{1-e1-f1}P_{e1}As_{f1}$ ($0 \leq a1$, $0 \leq b1$, $a1+b1 \leq 1$, $0 \leq e1$, $0 \leq f1$, $e1+f1<0.5$), and the barrier layer comprising $Al_{a2}In_{b2}Ga_{1-a2-b2}N_{1-e2-f2}P_{e2}As_{f2}$ ($0 \leq a2$, $0 \leq b2$, $a2+b2 \leq 1$, $0 \leq e2$, $0 \leq f2$, $e2+f2<0.5$);

an $In_{y2}Ga_{1-y2}N$ ($0<y2<1$) upper guide layer; and an $Al_{x2}Ga_{1-x2}N$ ($0.05 \leq x2 \leq 0.2$) upper cladding layer, wherein:

the thickness d1 μm of the lower guide layer, the In composition y1 of the lower guide layer, the thickness d2 μm of the upper guide layer, and the In composition y2 of the upper guide layer satisfy the following relationships:

$0.06 \leq d1+d2$, $0.01 \leq y1$, and $0.01 \leq y2$.

10. A semiconductor laser device according to claim 9, wherein the thickness d1 μm of the lower guide layer and the In composition y1 of the lower guide layer satisfy the following relationship: $y1 \geq 0.003/d1 - 0.003$.

11. A semiconductor laser device according to claim 10, wherein the thickness d1 μm of the lower guide layer and the In composition y1 of the lower guide layer satisfy the following relationship: $y1 \geq 0.003/d1 + 0.002$.

12. A semiconductor laser device according to claim 9, wherein the thickness d2 μm of the upper guide layer and the In composition y2 of the upper guide layer satisfy the following relationship: $y2 \geq 0.003/d2 - 0.003$.

13. A semiconductor laser device according to claim 12, wherein the thickness d2 μm of the upper guide layer and the In composition y2 of the upper guide layer satisfy the following relationship: $y2 \geq 0.003/d2 + 0.002$.

14. A semiconductor laser device according to claim 9, wherein the In composition y1 of the lower guide layer, the thickness d1 μm of the lower guide layer, the In composition y2 of the upper guide layer, the thickness d2 μm of the upper guide layer and the thickness Wa μm of the active layer satisfy the following relationship:

$$y \geq 0.003/d - 0.003 + (0.007 - 0.022 \times Wa)$$

wherein $d = (d1+d2)/2$, and $y = (y1 \times d1 + y2 \times d2)/(d1+d2)$.

15. A semiconductor laser device according to claim 14, wherein the In composition y1 of the lower guide layer, the thickness d1 μm of the lower guide layer, the In composition y2 of the upper guide layer, the thickness d2 μm of the upper guide layer and the thickness Wa μm of the active layer satisfy the following relationship:

$$y \geq 0.003/d - 0.002 + (0.007 - 0.022 \times Wa)$$

wherein $d = (d1+d2)/2$, and $y = (y1 \times d1 + y2 \times d2)/(d1+d2)$.

16. A semiconductor laser device according to claim 9, wherein the In composition y1 of the lower guide layer, the thickness d1 of the lower guide layer, the Al composition x1 of the lower cladding layer, the In composition y2 of the upper guide layer, the thickness d2 of the upper guide layer and the Al composition x2 of the upper cladding layer satisfy the following relationship:

$$y \geq 0.003/d - 0.003 + (-0.010 + 0.10 \times x)$$

wherein $d = (d1+d2)/2$, $y = (y1 \times d1 + y2 \times d2)/(d1+d2)$, and $x = (x1+x2)/2$.

17. A semiconductor laser device according to claim 16, wherein the In composition y1 of the lower guide layer, the thickness d1 of the lower guide layer, Al composition x1 of the lower cladding layer, the In composition y2 of the upper guide layer, the thickness d2 of the upper guide layer and the Al composition x2 of the upper cladding layer satisfy the following relationship:

$$y \geq 0.003/d + 0.002 + (-0.010 + 0.10 \times x)$$

wherein $d = (d1+d2)/2$, $y = (y1 \times d1 + y2 \times d2)/(d1+d2)$, and $x = (x1+x2)/2$.

18. An optical information reproduction apparatus, comprising:
a semiconductor laser device according to claim 9; and
a photodetector, wherein:
laser light is emitted from the semiconductor laser device to irradiate an optical disk, and information recorded on the optical disk is reproduced based on the laser light reflected from the optical disk.

19. A semiconductor laser device, comprising, in this order:
a GaN layer;
an $Al_{x1}Ga_{1-x1}N$ ($0.05 \leq x \leq 0.2$) lower cladding layer;
an $In_{y1}Ga_{1-y1}N$ ($0<y1<1$) lower guide layer (thickness: d1 [$\mu$m]);
an active layer (thickness: Wa [$\mu$m]) having a multilayer structure comprising alternating layers of a well layer and a barrier layer, the well layer comprising $Al_{a1}In_{b1}Ga_{1-a1-b1}N_{1-e1-f1}P_{e1}As_{f1}$ ($0 \leq a1$, $0 \leq b1$, $a1+b1 \leq 1$, $0 \leq e1$, $0 \leq f1$, $e1+f1<0.5$), and the barrier layer comprising $Al_{a2}In_{b2}Ga_{1-a2-b2}N_{1-e2-f2}P_{e2}As_{f2}$ ($0 \leq a2$, $0 \leq b2$, $a2+b2 \leq 1$, $0 \leq e2$, $0 \leq f2$, $e2+f2<0.5$);
an $In_{y2}Ga_{1-y2}N$ ($0<y2<1$) upper guide layer (thickness: d2 [$\mu$m]); and
an $Al_{x2}Ga_{1-x2}N$ ($0.05 \leq x2 \leq 0.2$) upper cladding layer, wherein:
the GaN layer is a GaN substrate.

20. A semiconductor laser device, comprising, in this order:
a GaN layer;
an $Al_{x1}Ga_{1-x1}N$ ($0.05 \leq x1 \leq 0.2$) lower cladding layer;
an $In_{y1}Ga_{1-y1}N$ ($0<y1<1$) lower guide layer (thickness: d1 [$\mu$m]);
an active layer (thickness: Wa [$\mu$m]) having a multilayer structure comprising alternating layers of a well layer and a barrier layer, the well layer comprising $Al_{a1}In_{b1}Ga_{1-a1-b1}N_{1-e1-f1}P_{e1}As_{f1}$ ($0 \leq a1$, $0 \leq b1$, $a1+b1 \leq 1$, $0 \leq e1$, $0 \leq f1$, $e1+f1<0.5$), and the barrier layer comprising $Al_{a2}In_{b2}Ga_{1-a2-b2}N_{1-e2-f2}P_{e2}As_{f2}$ ($0 \leq a2$, $0 \leq b2$, $a2+b2 \leq 1$, $0 \leq e2$, $0 \leq f2$, $e2+f2<0.5$);
an $In_{y2}Ga_{1-y2}N$ ($0<y2<1$) upper guide layer (thickness: d2 [$\mu$m]); and
an $Al_{x2}Ga_{1-x2}N$ ($0.05 \leq x2 \leq 0.2$) upper cladding layer, wherein:
the said well layer is GaNP or GaNAs.

21. A semiconductor laser device, comprising, in this order:
a GaN layer;
an $Al_{x1}Ga_{1-x1}N$ ($0.05 \leq x \leq 0.2$) lower cladding layer;
a lower guide layer (thickness: d1 [$\mu$m]);
an active layer (thickness: Wa [$\mu$m]) having a multilayer structure comprising alternating layers of a well layer and a barrier layer, the well layer comprising $Al_{a1}In_{b1}Ga_{1-a1-b1}N_{1-e1-f1}P_{e1}As_{f1}$ ($0 \leq a1$, $0 \leq b1$, $a1+b1 \leq 1$, $0 \leq e1$, $0 \leq f1$, $e1+f1<0.5$), and the barrier layer comprising $Al_{a2}In_{b2}Ga_{1-a2-b2}N_{1-e2-f2}P_{e2}As_{f2}$ ($0 \leq a2$, $0 \leq b2$, $a2+b2 \leq 1$, $0 \leq e2$, $0 \leq f2$, $e2+f2<0.5$);
an upper guide layer (thickness: d2 [$\mu$m]); and
an $Al_{x2}Ga_{1-x2}N$ ($0.05 \leq x2 \leq 0.2$) upper cladding layer, wherein:
the lower guide layer and/or the upper guide layer are GaNAs, GaNP, GaNPAs, InGaNAs, InGaNP, InGaNPAs, TlGaN or TlInGaN.

* * * * *

UNITED STATES PATENT AND TRADEMARK OFFICE
CERTIFICATE OF CORRECTION

PATENT NO. : 6,493,367 B1
DATED : December 10, 2002
INVENTOR(S) : Shigetoshi Ito et al.

It is certified that error appears in the above-identified patent and that said Letters Patent is hereby corrected as shown below:

<u>Title page,</u>
Item [57], ABSTRACT,
Line 5, please replace "have" with -- having --;
Line 7, please replace "$Al_{s1}$" with -- $Al_{a1}$ --;

<u>Column 1,</u>
Line 25, please replace "$Al_{0.7}$" with -- $Al_{0.07}$ --;

<u>Column 2,</u>
Line 23, please replace "1602:" with -- 1602; --;
Line 50, please replace "$P_{2e}$" with -- $P_{e2}$ --;
Line 65, please replace "$N_{1\text{-}a1\text{-}fl}$" with -- $N_{1\text{-}el\text{-}fl}$ --;
Line 65, please replace "$P_{a1}$" with -- $P_{e1}$ --;

<u>Column 3,</u>
Line 16, please replace "$Al_{s1}$" with -- $Al_{a1}$ --;
Line 16, please replace "$P_{s1}$" with -- $P_{e1}$ --;
Line 41, please replace "$Al_{s1}$" with -- $Al_{a1}$ --;

<u>Column 4,</u>
Line 31, please replace "and" with -- an --;
Line 44, please replace "$y1 \leq 0.003/d1$" with -- $yl \geq 0.003/d1$ --;

<u>Column 5,</u>
Line 15, please replace "the Al composition y2" with -- the Al composition x1 of the lower cladding layer, the In composition y2 --;

<u>Column 8,</u>
Line 4, please replace "$N(0>y1<b1)$" with -- $N(0<y1<b1)$ --;
Line 19, please replace "then-GaN" with -- then n-GaN --;
Line 45, please replace "$0<t1$" with -- $0<t<1$ --;

<u>Column 9,</u>
Line 19, please replace "thickness" with -- thicknesses --;
Lines 25-30, please un-bold all numbers.
Line 30, please replace "$0.3 \leq d1+d2$" with -- $0.3 < d1+d2$ --;
Lines 42, 54 and 63, "thickness" with -- thicknesses --;

UNITED STATES PATENT AND TRADEMARK OFFICE
CERTIFICATE OF CORRECTION

PATENT NO. : 6,493,367 B1
DATED : December 10, 2002
INVENTOR(S) : Shigetoshi Ito et al.

It is certified that error appears in the above-identified patent and that said Letters Patent is hereby corrected as shown below:

Column 10,
Line 1, please replace "$Ga_{1-\ x1}N$" with -- $Ga_{1-x1}N$ --;
Line 2, please replace "$Ga_{1-y}N$" with -- $Ga_{1-yl}N$ --;
Line 10, please replace "(Z=0.2)" with -- (z=0.2) --;
Line 14, please replace "(thickness: 0.5 $\mu$m) with -- (thickness: 0.1 $\mu$m) --;
Line 51, please replace "0, 1.e." with -- 0, i.e. --;

Column 11,
Lines 12 and 23, please replace "thickness" with -- thicknesses --;
Line 36, please replace "$y1 \geq 003/d1-0.003$" with -- $y1 \geq 0.003/d1-0.003$ --;
Line 41, please replace "$y2 \leq 0.003/d2-0.003$" with -- $y2 \geq 0.003/d2-0.003$ --;

Column 12,
Line 55, please replace "factors," with -- factors: --;
Line 57, please replace "comparative" with -- composition --;

Column 13,
Line 13, please replace "out" with -- or --;
Line 25, please replace "to" with -- in --;
Line 31, please replace "(20°C.)." with -- (20°C). --;
Line 41, please replace "wavelength;" with -- wavelength: --;
Line 44, please replace "thickness;" with -- thickness: --;
Line 55, please replace "percent" with -- present --;

Column 14,
Line 49, please replace "layer" with -- layers --;
Line 54, please replace "±0.005" with -- +0.005 --;
Line 66, please replace "$y \leq 0.003/d$" with -- $y \geq 0.003/d$ --;

Column 15,
Line 4, please replace "$y \leq 0.003$" with -- $y \geq 0.003$ --;
Line 22, please replace "(20°C.)," with -- (20°C), --;
Line 39, please replace "$Ga_{1-x}N$" with -- $Ga_{1-x1}N$ --;

Column 16,
Line 25, please replace "that a" with -- that the --;
Line 30, please replace "013" with -- 103 --;
Line 37, please replace "0.145 it" with -- 0.145, it --;

UNITED STATES PATENT AND TRADEMARK OFFICE
CERTIFICATE OF CORRECTION

PATENT NO. : 6,493,367 B1
DATED : December 10, 2002
INVENTOR(S) : Shigetoshi Ito et al.

It is certified that error appears in the above-identified patent and that said Letters Patent is hereby corrected as shown below:

Column 17,
Line 24, please replace "(nm" with -- nm --;
Line 24, please replace "(20° C.)." with -- (20° C). --;

Column 18,
Line 10, please remove the word "described";
Line 12, please replace "n-In$_c$Ga$_{1-c}$N inter-" with -- n-In$_c$Ga$_{1-c}$N second inter- --;

Column 20,
Lines 1 and 19, please replace "thickness;" with -- thickness: --;

Column 24,
Line 22, please replace "-0.022xWa)" with -- -0.22xWa) --;
Line 35, please replace "y≥0.003/d-0.002+(0.007-0.022xWa)" with -- y≥0.003/d-0.002+(0.007-0.22xWa) --;

Column 26,
Line 17, please replace "(0.05≤x≤0.2)" with -- (0.05≤x1≤0.2) --.

Signed and Sealed this

Seventeenth Day of June, 2003

JAMES E. ROGAN
*Director of the United States Patent and Trademark Office*